United States Patent
Fatin Farhanah et al.

(10) Patent No.: US 12,119,287 B2
(45) Date of Patent: Oct. 15, 2024

(54) CHIP PACKAGE POSITIONING AND FIXING STRUCTURE

(71) Applicant: Hitachi Astemo, Ltd., Hitachinaka (JP)

(72) Inventors: Binti Haridan Fatin Farhanah, Hitachinaka (JP); Takayuki Yogo, Hitachinaka (JP); Hiroyuki Abe, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 721 days.

(21) Appl. No.: 17/288,618

(22) PCT Filed: Sep. 20, 2019

(86) PCT No.: PCT/JP2019/036909
§ 371 (c)(1),
(2) Date: Apr. 26, 2021

(87) PCT Pub. No.: WO2020/095548
PCT Pub. Date: May 14, 2020

(65) Prior Publication Data
US 2021/0398886 A1    Dec. 23, 2021

(30) Foreign Application Priority Data

Nov. 5, 2018    (JP) .................................. 2018-208459

(51) Int. Cl.
*H01L 23/49*    (2006.01)
*G01F 5/00*    (2006.01)
(Continued)

(52) U.S. Cl.
CPC .............. *H01L 23/495* (2013.01); *G01F 5/00* (2013.01); *H01L 23/04* (2013.01); *H01L 23/31* (2013.01);
(Continued)

(58) Field of Classification Search
CPC . H01L 23/495; H01L 29/84; H01L 23/49548; H01L 23/49541;
(Continued)

(56) References Cited

U.S. PATENT DOCUMENTS 7,640,798 B2 *    1/2010    Oda ...................... G01F 1/6845
73/204.26
2005/0120790 A1 *    6/2005    Tanaka .................. G01F 1/6845
73/204.26
(Continued)

FOREIGN PATENT DOCUMENTS

CN    102575955 A    7/2012
JP    5-326911 A    12/1993
(Continued)

OTHER PUBLICATIONS

International Search Report (PCT/ISA/210) issued in PCT Application No. PCT/JP2019/036909 dated Nov. 12, 2019 with English translation (four (4) pages).
(Continued)

*Primary Examiner* — Shouxiang Hu
(74) *Attorney, Agent, or Firm* — Crowell & Moring LLP

(57) ABSTRACT

To obtain a chip package positioning structure capable of adjusting a tilt and a position of a chip package with respect to the circuit board and reducing mounting variations. The chip package positioning and fixing structure that positions and fixes, to a circuit board 4, a chip package 5 in which a flow rate detection element 53 is sealed with a resin so that a detection portion is at least exposed, in which the chip package includes a solder fixation portion 52 that fixes the chip package to the circuit board by soldering, and a positioning portion 514 that performs positioning to the
(Continued)

circuit board, and the positioning portion is provided closer to the flow rate detection element from the solder fixation portion.

8 Claims, 27 Drawing Sheets

(51) Int. Cl.

| | | |
|---|---|---|
| *H01L 23/04* | (2006.01) | |
| *H01L 23/31* | (2006.01) | |
| *H01L 23/495* | (2006.01) | |
| *H01L 29/84* | (2006.01) | |
| *H05K 1/18* | (2006.01) | |
| *H05K 3/34* | (2006.01) | |

(52) U.S. Cl.
CPC ........ *H01L 23/49551* (2013.01); *H01L 29/84* (2013.01); *H05K 1/18* (2013.01); *H05K 3/3421* (2013.01); *H05K 3/3494* (2013.01); *H01L 2224/83815* (2013.01); *H05K 2203/043* (2013.01)

(58) Field of Classification Search
CPC ........ H01L 23/49575; H01L 23/49551; H01L 23/04; H01L 23/31; H01L 2224/83815; G01F 5/00; G01F 1/6845; G01F 15/04; H05K 1/18; H05K 3/3421; H05K 3/3494; H05K 2203/043; H05K 2203/0165; H05K 2203/167

See application file for complete search history.

(56) References Cited

U.S. PATENT DOCUMENTS

| | | | |
|---|---|---|---|
| 2011/0140211 A1 | 6/2011 | Kono et al. | |
| 2013/0192388 A1 | 8/2013 | Kono et al. | |
| 2016/0276566 A1 | 9/2016 | Pirk et al. | |
| 2018/0073905 A1* | 3/2018 | Kono | .................. H01L 23/495 |

FOREIGN PATENT DOCUMENTS

| | | |
|---|---|---|
| JP | 2005-45110 A | 2/2005 |
| JP | 2011-122984 A | 6/2011 |
| JP | 2012-242298 A | 12/2012 |
| JP | 2015-17857 A | 1/2015 |

OTHER PUBLICATIONS

Japanese-language Written Opinion (PCT/ISA/237) issued in PCT Application No. PCT/JP2019/036909 dated Nov. 12, 2019 (four (4) pages).

Chinese-language Office Action issued in Chinese Application No. 201980065531.X dated Aug. 12, 2023 with English translation (10 pages).

* cited by examiner

CHIP PACKAGE POSITIONING AND FIXING STRUCTURE

TECHNICAL FIELD

The present invention relates to a chip package positioning and fixing structure.

BACKGROUND ART

PTL 1 discloses that "in a positioning structure of an electronic component in a reflow soldering step in which a printed circuit board 1 having a surface mount electronic component 2 temporarily set on a pad 3 with cream solder 4 coated on the pad 3 is transported into a reflow furnace by a transportation conveyor, and the electronic component 2 is soldered to the printed circuit board 1, a package 7 made of an insulating resin in the electronic component 2 is equipped with an engagement unit 9 that is engaged in an engaged portion 5 formed at a place where the electronic component 2 is mounted on the printed circuit board 1 to prevent displacement of the electronic component 2 relative to the printed circuit board 1".

CITATION LIST

Patent Literature

PTL 1: JP 2005-45110 A

SUMMARY OF INVENTION

Technical Problem

For example, in a case of a structure in which a chip package having a detection element is cantilever-supported by a circuit board, the chip package may be tilted or displaced with respect to the circuit board during solder reflow, which causes variations in characteristics of the detection element.

The present invention has been made in view of the above circumstances, and an object of the present invention is to provide a chip package positioning and fixing structure capable of adjusting a tilt and a position of a chip package with respect to a circuit board and reducing mounting variations.

Solution to Problem

In order to solve the above problems, the present invention provides a chip package positioning and fixing structure that positions and fixes, to a circuit board, a chip package in which a flow rate detection element is sealed with a resin so that a detection portion is at least exposed, in which the chip package includes a solder fixation portion that fixes the chip package to the circuit board by soldering, and a positioning portion that performs positioning to the circuit board, and the positioning portion is provided closer to the flow rate detection element from the solder fixation portion.

Advantageous Effects of Invention

According to the present invention, it is possible to adjust the tilt of the chip package with respect to the circuit board and reduce the mounting variations.

Further features related to the present invention will become apparent from the description of the present specification and the accompanying drawings. In addition, problems, configurations, and effects other than those described above will be clarified by the following description of embodiments.

BRIEF DESCRIPTION OF DRAWINGS

FIG. 9 is diagram

DESCRIPTION OF EMBODIMENTS

Description of Embodiments described below (hereinafter, referred to as embodiments) solves various problems desired as a practical product, solves various problems which are demanded to be used as a detection device that detects a physical quantity of intake air of, particularly, a vehicle, and can obtain various effects. One of various problems addressed by the following embodiments is described in the "Technical Problem" described above, and one of various effects obtained by the following embodiments is described in the "Advantageous Effects of Invention". The various problems solved by the following embodiments and the various effects produced by the following embodiments will be described in the description of the following embodiments. Therefore, the problems and effects described in the following examples are also described in the contents other than the contents of the Technical Problem and the Advantageous Effects of Invention.

In the following embodiments, the same reference sign represents the same component even though drawing numbers are different from each other, and attains the same operational effect. With respect to the components that have been described already, only a reference sign will be given to the drawings, and description thereof may be omitted.

First Embodiment

Figure 1:
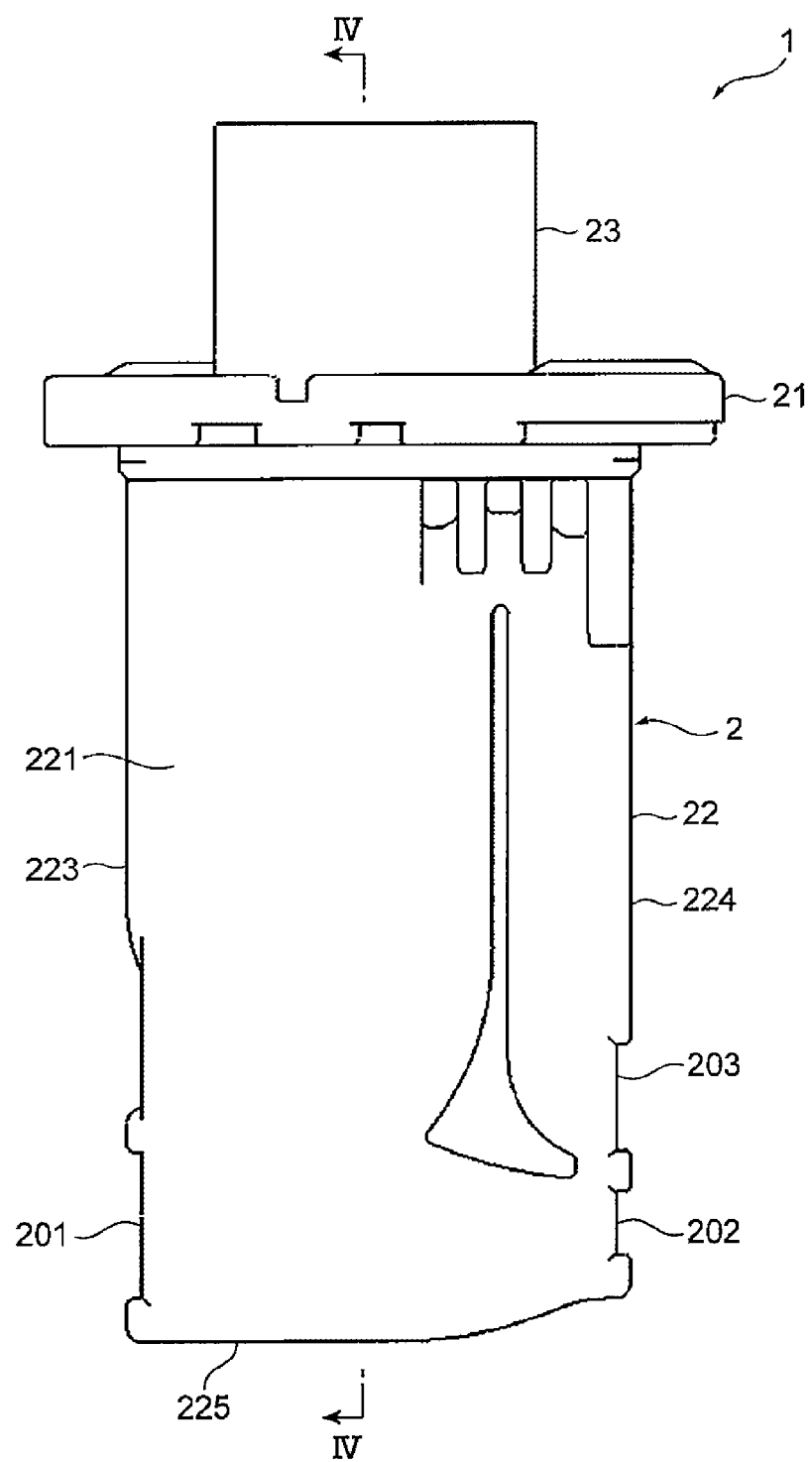
FIG. 1 is a front view of physical quantity detection device.
Figure 2:
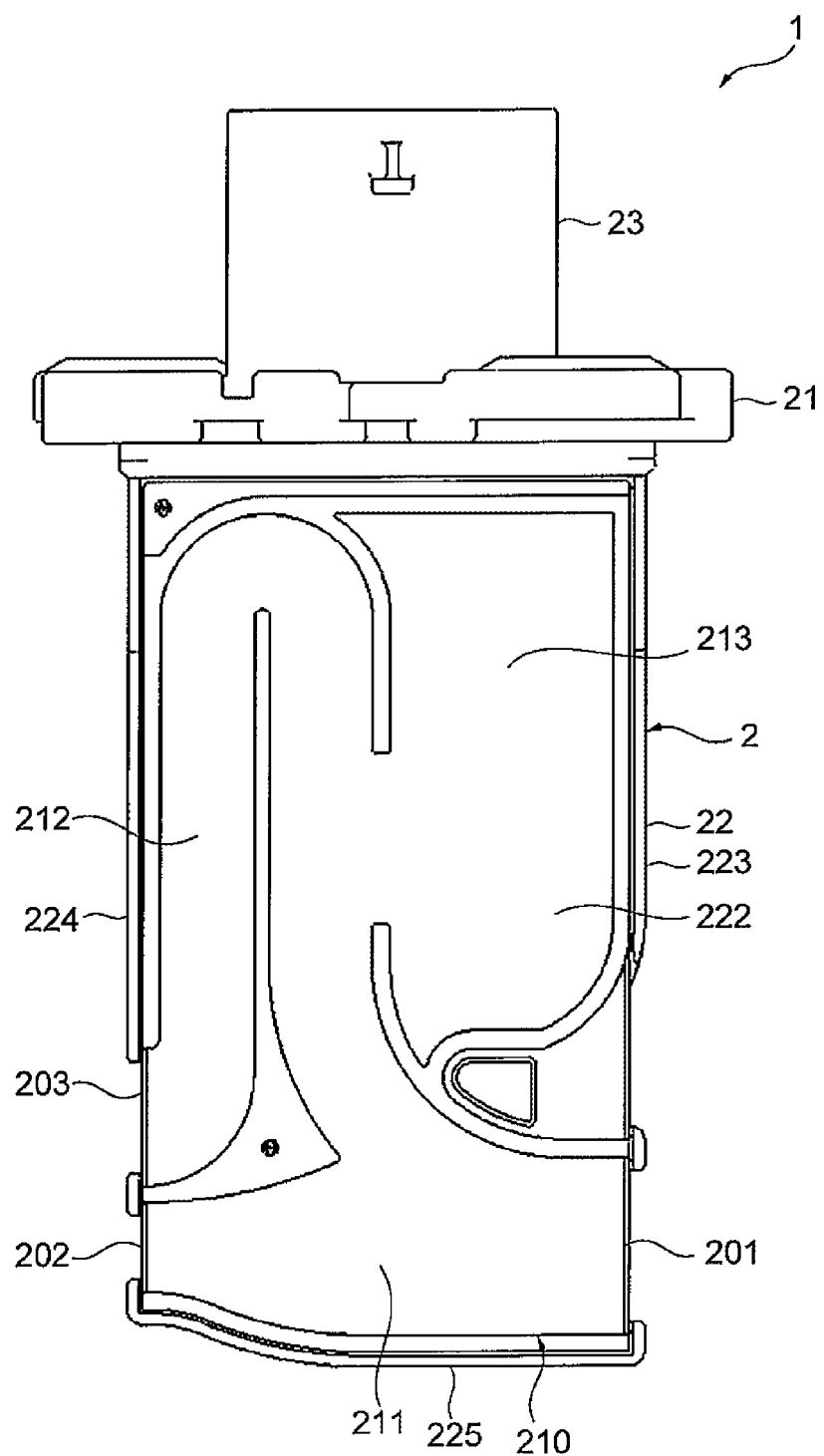
FIG. 2 is a rear view of a housing.
Figure 3:
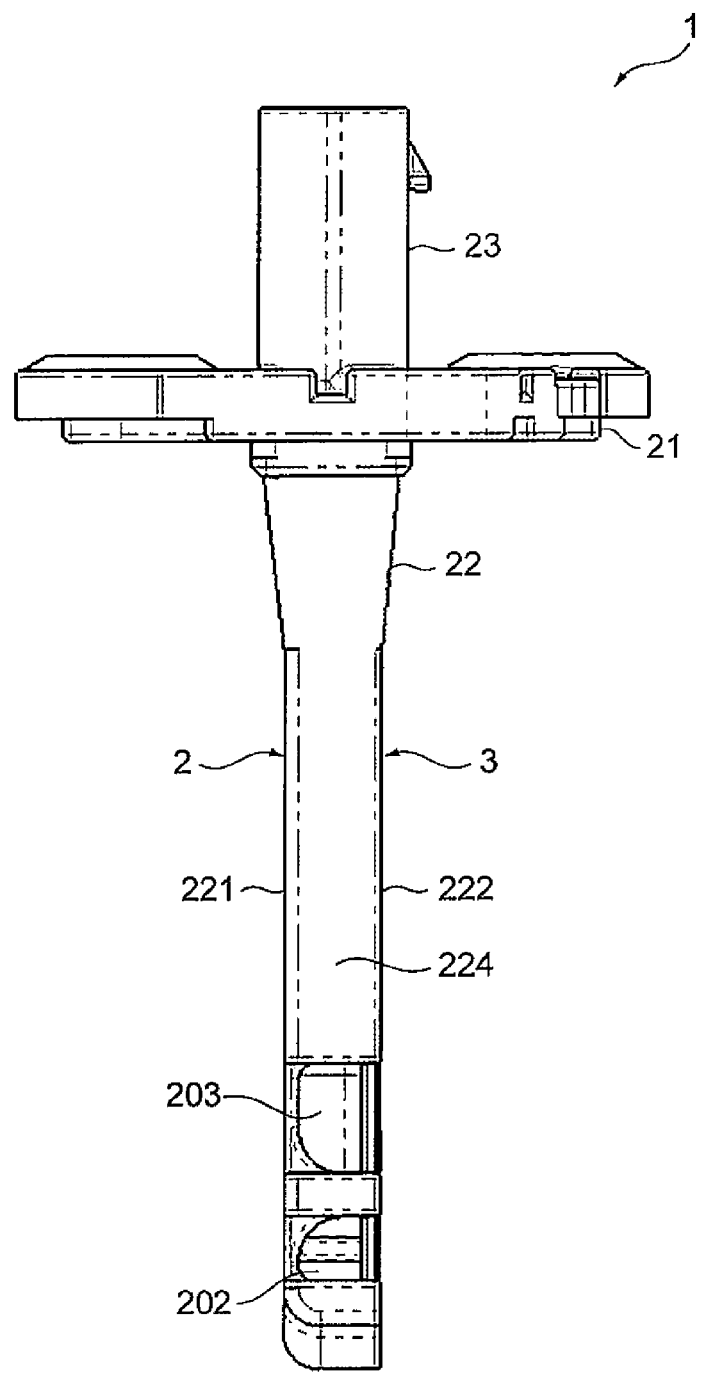
FIG. 3 is a right side view of the physical quantity detection device.

FIGS. 1 to 3 are views illustrating an appearance of a physical quantity detection device. FIG. 1 is a front view of the physical quantity detection device, FIG. 2 is a rear view of a housing, and FIG. 3 is a right side view of the physical quantity detection device.

A physical quantity detection device 1 of the present embodiment is a device for detecting a physical quantity of intake air sucked into an internal combustion engine of an automobile, and is mounted on an intake pipe of the internal combustion engine.

The physical quantity detection device 1 is used by being inserted into the intake pipe from an attaching hole provided in a passage wall of the intake pipe. The physical quantity detection device 1 includes a housing 2 and a cover 3 attached to the housing 2. The housing 2 is formed by injection molding a synthetic resin material, and the cover 3 is composed of a plate-shaped member formed of a conductive material such as an aluminum alloy. The cover 3 is formed in a thin plate shape and has a wide and flat cooling surface.

The housing 2 includes a flange 21 for fixing the physical quantity detection device 1 to the intake pipe, a connector 23 protruding from the flange 21 and exposed to the outside from an intake body for electrical connection with an external device, and a measurement portion 22 extending from the flange 21.

The measurement portion 22 has a thin and elongated shape extending straight from the flange 21, and has a wide front and rear surfaces 221 and 222, and a pair of narrow side surfaces 223 and 224. The measurement portion 22 protrudes from an inner wall of the intake pipe toward a center of the passage of the intake pipe in a state where the physical quantity detection device 1 is attached to the intake pipe. The front and rear surfaces 221 and 222 are disposed in parallel along a central axis of the intake pipe, and among the narrow side surfaces 223 and 224 of the measurement portion 22, the side surface 223 on one side of the measurement portion 22 in a lateral direction is disposed opposite to an upstream of the intake pipe, and the side surface 224 on the other side of the measurement portion 22 in the lateral direction is disposed opposite to a downstream of the intake pipe. With the physical quantity detection device 1 attached to the intake pipe, a tip portion of the measurement portion 22 is a lower surface 225.

The physical quantity detection device 1 is provided with a sub-passage inlet 201 at the tip portion of the thin and elongated measurement portion 22 that extends from the flange 21 toward the center of the intake pipe, such that a measurement error related to a flow rate decrease near an inner wall surface can be reduced. In addition, the physical quantity detection device 1 is provided with not only the sub-passage inlet 201 at the tip portion of the measurement portion 22 extending from the flange 21 toward the center of the intake pipe, but also a first outlet 202 and a second outlet 203 of the sub-passage at the tip portion of the measurement portion 22, and thus the measurement error can be further reduced.

The physical quantity detection device 1 has a shape in which the measurement portion 22 extends along the axis from an outer wall toward the center of the intake pipe, but as illustrated in FIG. 3, widths of the side surfaces 223 and 224 are formed to be narrow. As a result, the physical quantity detection device 1 can suppress a fluid resistance against a measured gas to a small value.

The measurement portion 22 of the physical quantity detection device 1 is inserted into intake pipe from the attaching hole provided in the intake pipe, and the flange 21 of the physical quantity detection device 1 abuts on the intake pipe and fixed to the intake pipe with a screw. The flange 21 has a substantially rectangular shape having a predetermined plate thickness in a plan view.

Figure 4:
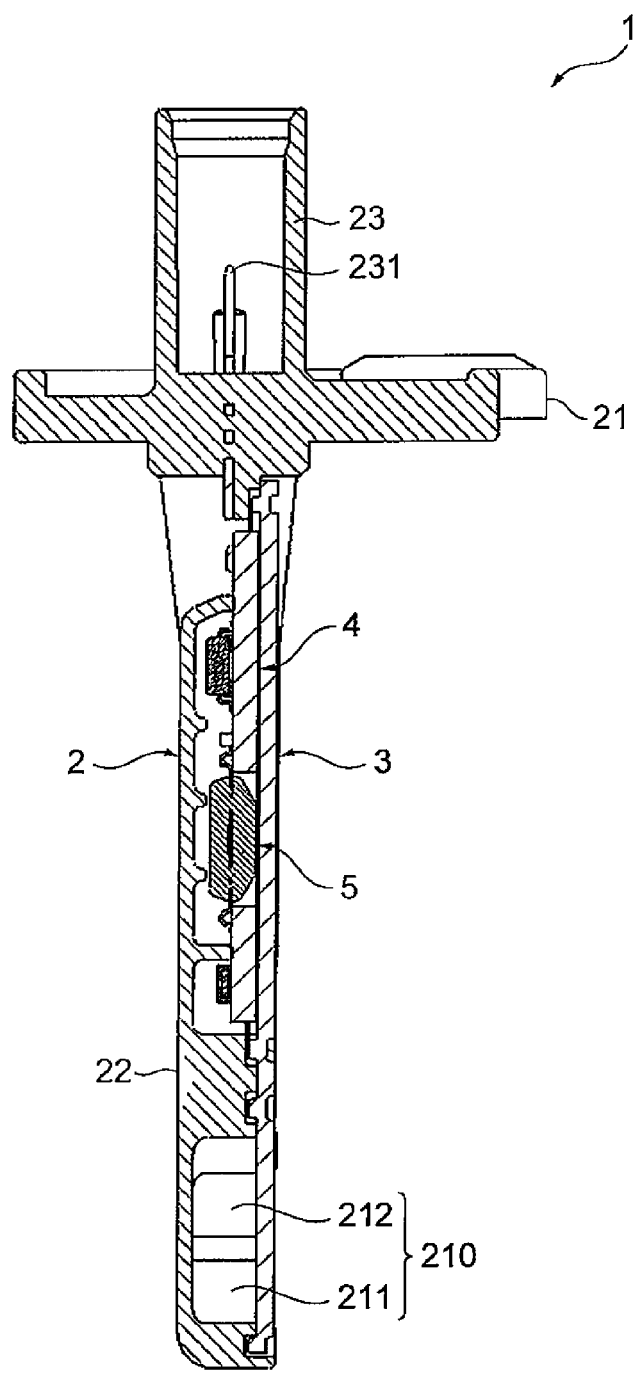
FIG. 4 is a cross-sectional view taken along line IV-IV in FIG. 1.
Figure 5:
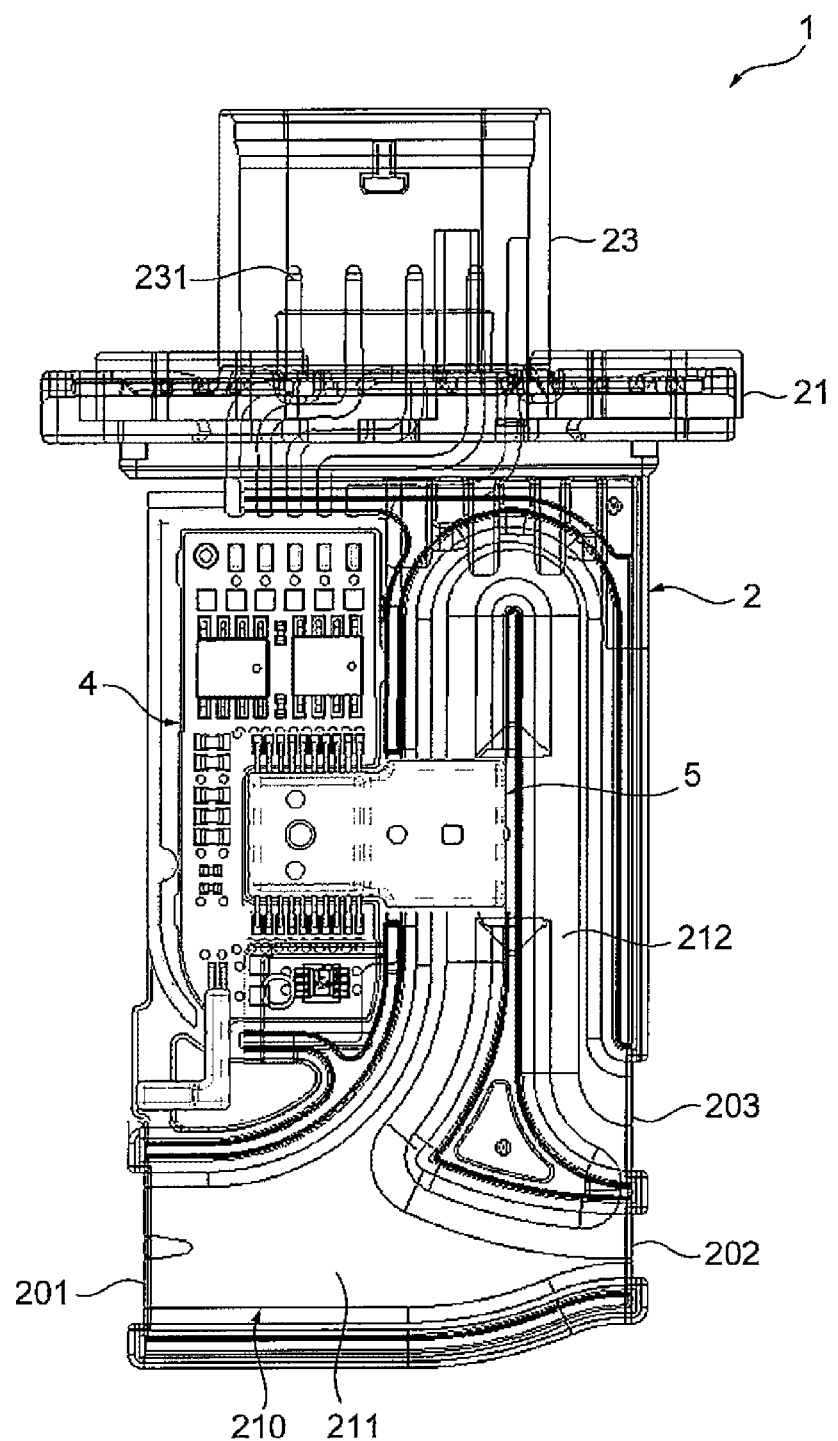
FIG. 5 is a front view of the physical quantity detection device showing the housing perspectively.

As illustrated in FIGS. 4 and 5, the connector 23 has an external terminal 231 provided therein. The external terminal 231 is a terminal for outputting physical quantities such as a flow rate and a temperature, as a measurement result of the physical quantity detection device 1, and a power supply terminal for supplying DC power for operating the physical quantity detection device 1.

The housing 2 is provided with a sub-passage groove 210 for forming the sub-passage and a circuit chamber 213 for accommodating the circuit board 4. The circuit chamber 213 and the sub-passage groove 210 are recessed in the rear surface 222 of the measurement portion 22. The circuit chamber 213 is provided in a region, which is located upstream of the intake pipe in a flow direction of the measured gas, on one side (side surface 223 side) in the lateral direction. The sub-passage groove 210 is provided over a region on the tip portion side of the measurement portion 22 in a longitudinal direction (lower surface 225 side) from the circuit chamber 213, and a region, which is located downstream of the intake pipe in the flow direction of the measured gas, on the other side (side surface 224 side) in the lateral direction from the circuit chamber 213.

The sub-passage groove 210 forms a sub-passage in cooperation with the cover 3. The sub-passage extends along a protruding direction (longitudinal direction) of the measurement portion 22. The sub-passage groove 210 forming the sub-passage has a first sub-passage groove 211, and a second sub-passage groove 212 that branches in the middle of the first sub-passage groove 211. The first sub-passage groove 211 is formed so as to extend along the lateral direction of the measurement portion 22 between the sub-passage inlet 201 opened to the side surface 223 on one side of the measurement portion 22 and the first outlet 202 opened to the side surface 224 on the other side of the measurement portion 22. The first sub-passage groove 211 forms a first sub-passage that takes in the measured gas flowing in the intake pipe from the sub-passage inlet 201 and returns the taken-in measured gas from the first outlet 202 to the intake pipe. The first sub-passage extends along the flow direction of the measured gas in the intake pipe from the sub-passage inlet 201 and leads to the first outlet 202.

The second sub-passage groove 212 branches at a position in the middle of the first sub-passage groove 211, is bent toward a base end portion side (flange side) of the measurement portion 22, and extends along the longitudinal direction of the measurement portion 22. Then, the second sub-passage groove 212 is bent toward the other side (side surface 224 side) of the measurement portion 22 in the lateral direction at the base end portion of the measurement portion 22, makes a U-turn at the tip portion of the measurement portion 22, and extends along the longitudinal direction of the measurement portion 22 again. Then, the second sub-passage groove 212 is provided to be bent toward the other side of the measurement portion 22 in the lateral direction in front of the first outlet 202, and connected to the second outlet 203 opened to the side surface 224 on the other side of the measurement portion 22. The second outlet 203 is disposed opposite to the downstream of the intake pipe in the flow direction of the measured gas. The second outlet 203 has an opening area substantially equal to or slightly larger than that of the first outlet 202, and is formed at a position adjacent to the base end portion side of the measurement portion 22 in the longitudinal direction from the first outlet 202.

The second sub-passage groove 212 forms a second sub-passage that allows the measured gas branched and flowed from the first sub-passage to pass therethrough, and returns the measured gas from the second outlet 203 to the intake pipe. The second sub-passage has a reciprocating path along the longitudinal direction of the measurement portion 22. That is, the second sub-passage has a path that branches in the middle of the first sub-passage, extends toward the base end portion side of the measurement portion 22, is folded on the base end portion side of the measurement portion 22 to extend toward the tip portion side of the measurement portion 22, and leads to the second outlet 203 that is disposed opposite to the downstream of the intake pipe in the flow direction of the measured gas from the downstream of the intake pipe in the flow direction of the measured gas from the sub-passage inlet 201. A flow rate detection element 53 is disposed at an intermediate position of the second sub-passage groove 212. The second sub-passage groove 212 can secure a length of the second sub-passage longer, and can reduce an influence on the flow rate detection element 53 when pulsation occurs in the intake pipe.

With the above configuration, it is possible to form the sub-passage along an extending direction of the measurement portion 22 and to secure sufficiently long sub-passage. As a result, the physical quantity detection device 1 can be provided with a sub-passage having a sufficient length. Therefore, the physical quantity detection device 1 can suppress the fluid resistance to a small value and measure a physical quantity of the measured gas with high accuracy.

Since the first sub-passage groove 211 extends along the lateral direction of the measurement portion 22 from the sub-passage inlet 201 to the first outlet 202, foreign matters, such as dust, which have entered the first sub-passage from the sub-passage inlet 201, can be discharged from the first outlet 202 as they are. Therefore, it is possible to prevent the foreign matters from entering the second sub-passage and to prevent the flow rate detection element 53 in the second sub-passage from being affected.

Of the sub-passage inlet 201 and the first outlet 202 of the first sub-passage groove 211, the sub-passage inlet 201 has a larger opening area than the first outlet 202. By making the opening area of the sub-passage inlet 201 larger than that of the first outlet 202, the measured gas that has flowed through the first sub-passage is surely guided to the second sub-passage branched in the middle of the first sub-passage.

Figure 6:
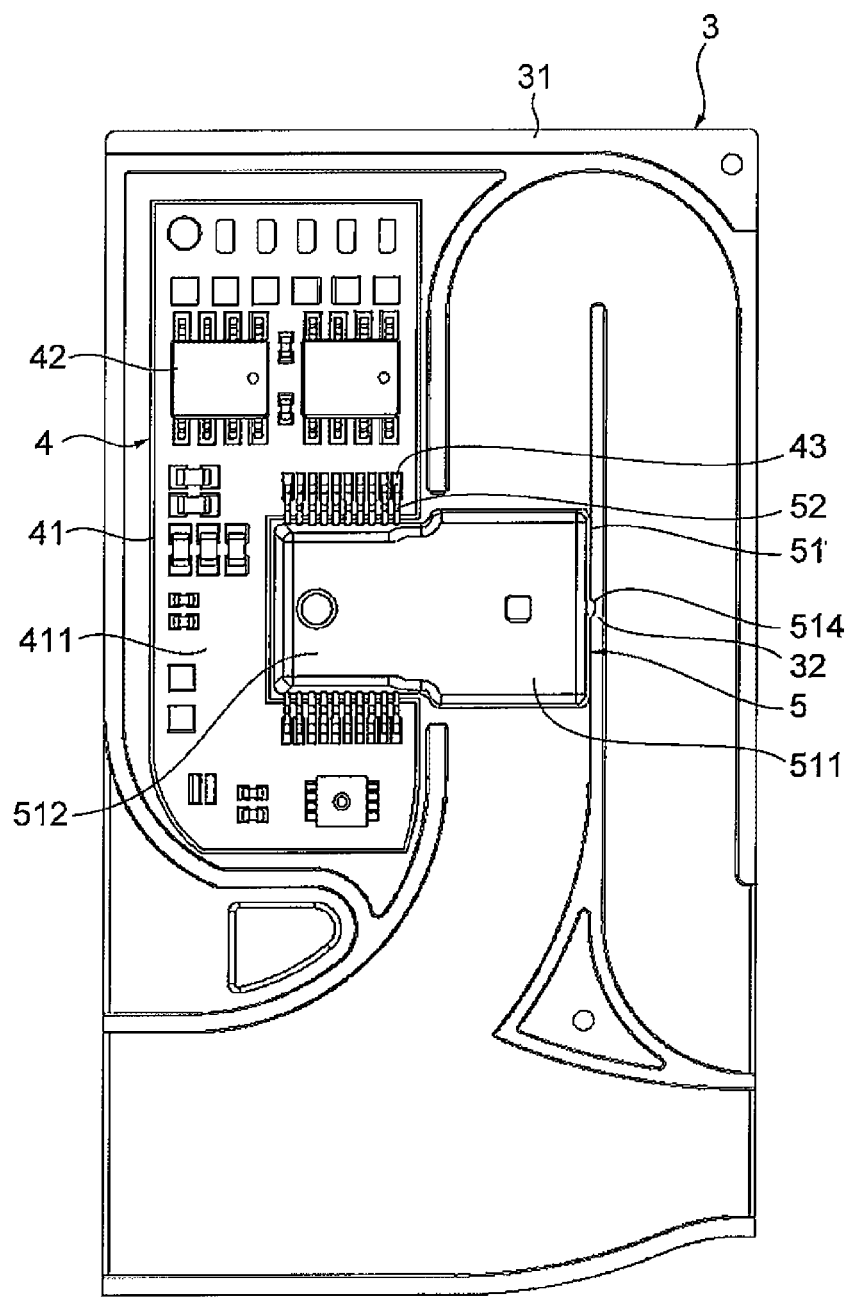
FIG. 6 is a diagram illustrating a configuration of a cover assembly.

FIG. 6 is a diagram illustrating a configuration of a cover assembly.

The cover assembly includes the cover 3 and the circuit board 4 on which the chip package 5 is mounted. The cover 3 is formed of a conductive metal material such as an aluminum alloy or a stainless alloy. The cover 3 is composed of a flat plate member having a size to cover the rear surface 222 of the measurement portion 22, and is fixed to the measurement portion 22 with an adhesive. The cover 3 covers the circuit chamber 213 of the measurement portion 22, and forms a sub-passage in cooperation with the first sub-passage groove 211 and the second sub-passage groove 212 of the measurement portion 22. The cover is electrically connected to a ground by interposing a conductive intermediate member between the cover 3 and a predetermined connector terminal, and has an antistatic function.

The circuit board 4 on which the chip package 5 is mounted is fixed to a back surface of the cover 3. The circuit board 4 has, for example, a substrate body 41 of a printed board. The substrate body 41 has a rectangular shape extending along the longitudinal direction of the measurement portion 22. The chip package 5 is fixed to the circuit board 4 at a center position in the longitudinal direction of the circuit board 4 in a state where the chip package 5 protrudes laterally from an end of the circuit board 4 along the lateral direction of the circuit board 4. A package body 51 of the chip package 5 has a base end portion 512 of which at least a part in the thickness direction of the circuit board 4 is accommodated in an accommodating portion 412 of the circuit board 4, and a tip portion 511 that protrudes laterally from the end of the circuit board 4 along the lateral direction of the circuit board 4.

In the cover assembly, the circuit board 4 is accommodated in the circuit chamber 213 by attaching the cover 3 to the rear surface 222 of the housing 2, and the chip package 5 is extended between the sub-passage and the circuit chamber 213, and the tip portion 511 of the package body 51 can thus be disposed in the sub-passage. The flow rate detection element 53 is provided at the tip portion 511 of the package body 51, and a detection portion of the flow rate detection portion is exposed and disposed in the second sub-passage groove 212.

Figure 7A:
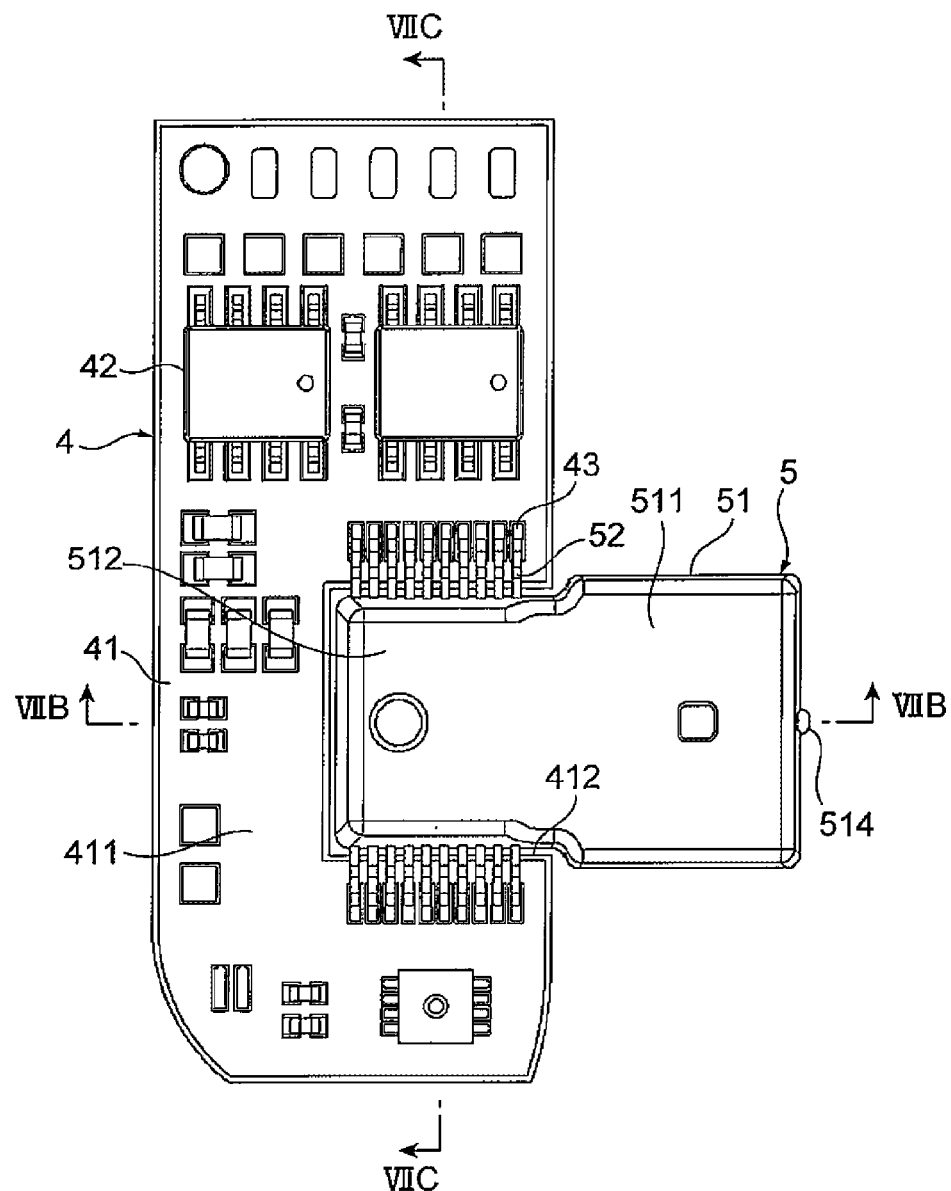
FIG. 7A is a front view of a circuit board on which a chip package and circuit components are mounted.
Figure 7B:
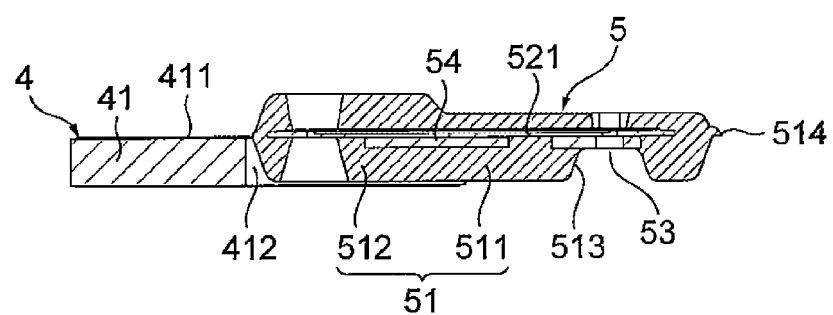
FIG. 7B is a cross-sectional view taken along line VIIB-VIIB in FIG. 7A.
Figure 7C:
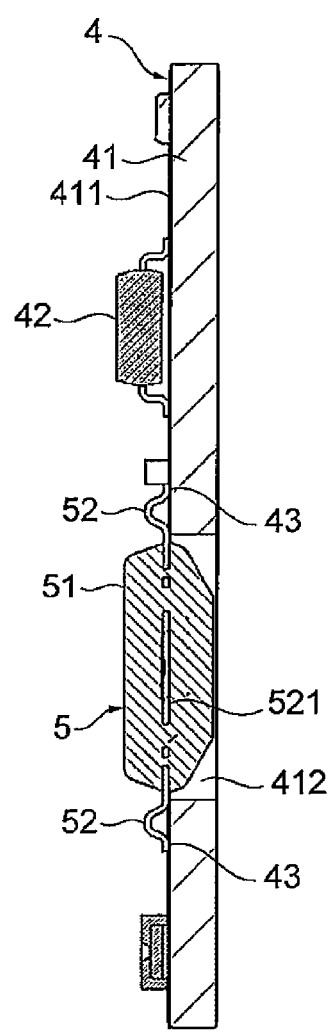
FIG. 7C is a cross-sectional view taken along line VIIC-VIIC in FIG. 7A.

FIG. 7A is a front view of a circuit board on which a chip package and circuit components are mounted, FIG. 7B is a cross-sectional view taken along line VIIB-VIIB in FIG. 7A, and FIG. 7C is a cross-sectional view taken along line VIIC-VIIC in FIG. 7A.

The circuit board 4 is provided with the accommodating portion 412 for accommodating a part of the chip package 5. As illustrated in FIG. 7A, the accommodating portion 412 is formed by partially cutting out a portion that is displaced at the center of the substrate body 41 in the longitudinal direction and at one side of the substrate body 41 in the lateral direction (cutout portion), and the substrate body 41 has a substantially U shape in a plan view.

As illustrated in FIGS. 7A, 7B, and 7C, at least a part of the package body 51 in the thickness direction of the chip package 5 gets into and is accommodated in the accommodating portion 412 of the circuit board 4.

Specifically, a package front surface portion, which is the base end portion 512 of the package body 51 and a surface on which the flow rate detection element 53 of the package body is provided, is accommodated while getting into the accommodating portion 412 of the circuit board 4.

In the present embodiment, the part of the package body in the thickness direction is accommodated in the accommodating portion 412 of the circuit board 4, such that a mounting height including a thickness of the chip package 5 and a height of the terminals can be controlled. As a result, for example, the mounting height can be reduced to the same height as a compact pressure sensor mounted on the circuit board 4 together with the chip package 5. Further, a mounting height of the mounted components can be controlled to be lower than that of the chip package 5 mounted by being stacked on the circuit board 4. Therefore, it is possible to reduce the height of the measurement portion 22, reduce the thickness of the physical quantity detection device 1, and reduce the flow rate resistance of the main passage in the intake pipe.

In the present embodiment, a case in which the part of the package body 51 in the thickness direction is accommodated in the accommodating portion 412 of the circuit board 4 has been described by way of example, but the entire package body 51 in the thickness direction may be accommodated in the accommodating portion 412 of the circuit board 4. With such a configuration, it is possible to further promote the reduction in height of the measurement portion 22 and reduce the thickness of the physical quantity detection device 1.

As illustrated in FIG. 7A, the chip package 5 and an electronic component such as a pressure sensor 42 are mounted on a front side of the circuit board 4. The chip package 5 is provided with a plurality of connection terminals 52 protruding from the base end portion 512 of the package body 51, and the connection terminals 52 are connected to a pad 43 of the circuit board 4 by soldering and fixed integrally to the circuit board 4. The chip package 5 is mounted with the flow rate detection element 53 and an LSI which is an electronic component for driving the flow rate detection element 53.

The base end portion 512 of the chip package 5 has a plurality of connection terminals 52 protruding in a direction in which the plurality of connection terminals 52 are spaced apart from each other along a lateral direction of the package body 51. A plurality of pads 43 are provided on the mounting surface 411 of the substrate body 41 of the circuit board 4 so as to be separated from one side and the other side in the longitudinal direction of the circuit board 4, the one side and the other side being portions facing each other with the accommodating portion 412 interposed therebetween, and the plurality of connection terminals 52 of the chip package 5 are soldered to the pads 43, respectively.

The plurality of connection terminals 52 are composed of a solder fixation portion that fixes the chip package 5 to the circuit board 4 by soldering.

The chip package 5 is configured by mounting an LSI 54 and the flow rate detection element 53 on a lead frame 521 and sealing the LSI 54 and the flow rate detection element 53 with a thermosetting resin. The chip package 5 has a package body resin-molded into a substantially flat plate shape. The package body 51 has a rectangular shape, extends along the lateral direction of the measurement portion 22, and is disposed so that the base end portion 512 on one side of the package body in the longitudinal direction is accommodated in the accommodating portion 412 of the circuit board 4 and the tip portion 511 on the other side of the package body 51 in the longitudinal direction protrudes from the circuit board 4.

The flow rate detection element 53 of the chip package 5 is provided so that the detection portion is exposed in a passage groove 513 that is recessed in a surface of the package body 51. The passage groove 513 is formed over the entire width from one end of the package body 51 in the lateral direction to the other end thereof in the lateral direction so as to extend along the second sub-passage groove 212 in the second sub-passage groove 212. The flow rate detection element 53 has a diaphragm structure. When the chip package 5 is molded with the resin, resin molding is performed by applying an insertion die so that the resin does not flow into the surface (detection portion) of the flow rate detection element 53. In the chip package 5, the flow rate detection element 53 is sealed with a resin so that the surface of the flow rate detection element 53 is exposed.

The connection terminal 52 of the chip package 5 protrudes from the center in the thickness direction of the package body to the lateral direction of the package body 51. The connection terminal 52 has a facing surface facing the pad 43 of the circuit board 4, and the facing surface is set to be positioned at the same height as the mounting surface of the lead frame 521.

The chip package 5 is electrically conducted and integrally fixed to the circuit board 4 by soldering the plurality of connection terminals 52 provided at the base end portion 512 of the package body 51 to the plurality of pads 43 of the circuit board 4, respectively. The base end portion 512 is fixed to the circuit board 4, and the tip portion 511 protrudes from the circuit board 4, such that the chip package 5 is so-called cantilever-supported by the circuit board 4.

Next, a method of mounting the chip package 5 on the circuit board 4 and attaching the circuit board 4 on which the chip package 5 is mounted to the housing will be described.

Figure 8A:
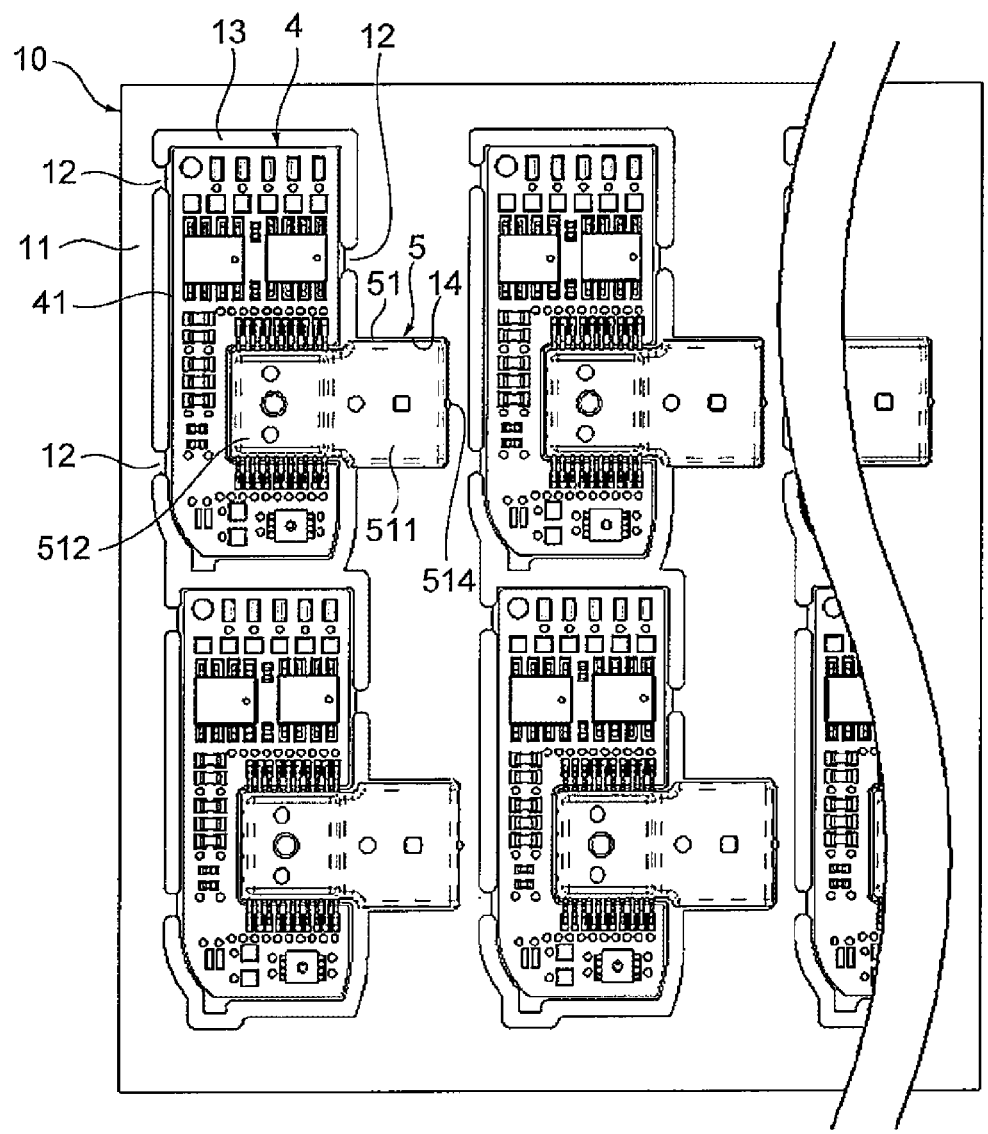
FIG. 8A is a front view of a substrate sheet.
Figure 8B:
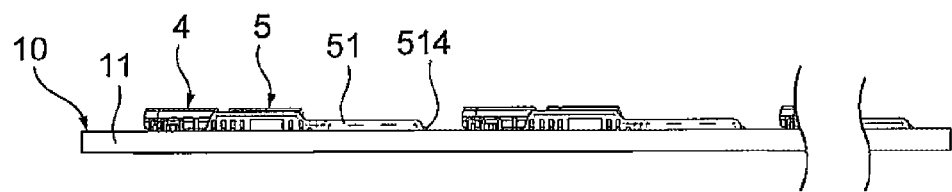
FIG. 8B is a bottom view of the substrate sheet.
Figure 9A:
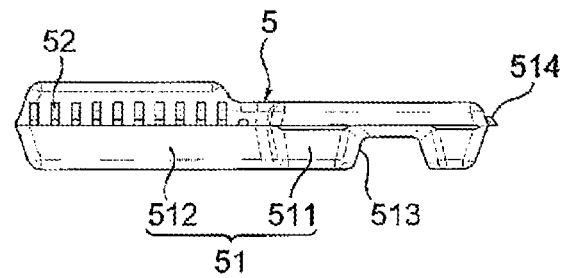
FIGS. 9A-9D are diagrams illustrating an assembling process of the chip package.
Figure 9B:
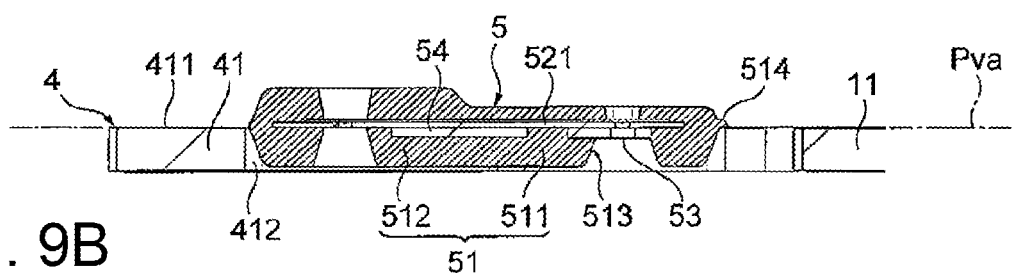
Figure 9C:
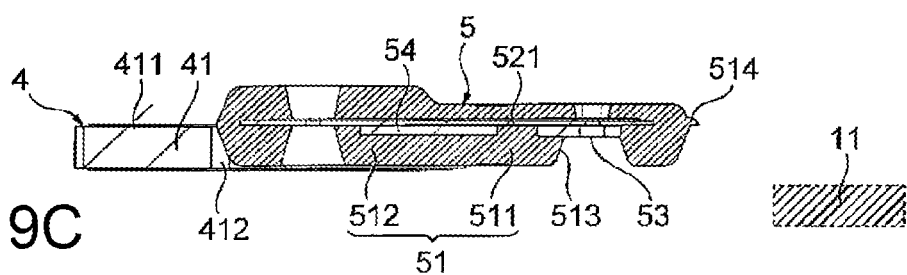
Figure 9D:
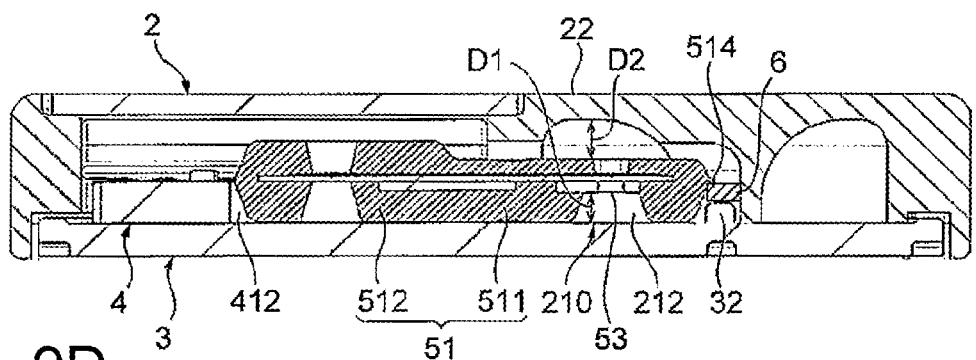

FIG. 8A is a front view of a substrate sheet, and FIG. 8B is a bottom view of the substrate sheet. The chip package 5 is mounted on the circuit board 4 by solder reflow. As illustrated in FIGS. 8A and 8B, the chip package 5 is transported to a reflow furnace while being set on a substrate sheet 10, and solder reflow is performed in the reflow furnace.

As illustrated in FIG. 8A, the substrate sheet 10 has a plurality of circuit boards 4 arranged side by side in a plane, and a waste substrate 11 that supports the plurality of circuit boards 4. The waste substrate 11 has a gap 13 with each circuit board 4, and supports each circuit board 4 via a gate 12. In the waste substrate 11, a cutout portion 14 is provided along the circuit board 4, and the tip portion 511 of the chip package 5 is accommodated when the chip package 5 is set on the substrate sheet 10.

FIG. 9 is diagram illustrating an assembling process of the chip package.

The chip package 5 is placed on the substrate sheet 10 and set at a predetermined position in an attitude in which a package front surface portion and a package back surface portion of the chip package 5 are positioned downward and upward. When the chip package 5 is set in the substrate sheet 10, the base end portion 512 is accommodated in the accommodating portion 412 of the circuit board 4, and the tip portion 511 is accommodated in the cutout portion 14 of the waste substrate 11.

Then, the connection terminals 52 of the chip package 5 are placed on the pads 43 provided on the mounting surface 411 of the circuit board 4, respectively, and the base end portion 512 of the package body 51 is supported by the circuit board 4. Since the chip package 5 is disposed so that the tip portion 511 of the package body 51 protrudes from the circuit board 4, the center of gravity of the chip package 5 is positioned closer to the tip portion 511 than the base end portion 512. Therefore, only by placing the connection terminals 52 of the package body 51 on the pads 43 of the circuit board 4 and supporting the connection terminals 52, balance of the chip package 5 may deteriorate, and the chip package 5 may be tilted so that the tip portion 511 of the package body 271 falls off.

In the present embodiment, a positioning portion for positioning the chip package 5 to the circuit board 4 is provided. The positioning portion is provided at a position closer to the flow rate detection element 53 than the connection terminal 52 of the chip package 5. The positioning portion has a convex portion 514 formed so as to protrude from the center of an edge of the tip portion 511 of the package body 51. The convex portion 514 is formed of a mold resin and integrally formed when the molding is performed on the package body 51.

The convex portion 514 has a placing surface placed on the waste substrate 11. The placing surface of the convex portion 514 has the same height as the facing surface of the connection terminal 52, and is positioned on a virtual plane Pva including the mounting surface 411 of the circuit board 4 when the chip package 5 is placed on the circuit board 4.

As illustrated in (2) of FIG. 9, the convex portion 514 is placed on the waste substrate 11 and supports the tip portion 511 of the package body 51 to the circuit board 4. As a result, in the chip package 5, the base end portion 512 of the package body 51 is supported by the circuit board 4, and the tip portion 511 is supported by the waste substrate 11. Therefore, it is possible to prevent the chip package 5 from tilting so that the tip portion 511 of the package body 51 falls off from the substrate sheet 10.

Then, the chip package 5 is transported to the reflow furnace while being set on the substrate sheet 10, and the solder reflow is performed in the reflow furnace to fix the chip package 5 to the circuit board 4 by soldering. When the chip package 5 is fixed to the circuit board 4 by soldering through the solder reflow, the gate 12 is cut and the circuit board 4 is separated from the waste substrate 11 as illustrated in (3) of FIG. 9. Then, the circuit board 4 is attached to the cover 3 to form a cover assembly, and as illustrated in (4) of FIG. 9, the housing 2 is attached to the cover assembly.

When the circuit board 4 on which the chip package 5 is mounted is attached to the cover 3, an adhesive 6 is applied between a projection 32 of the cover 3 and the convex portion 514. As a result, the tip portion 511 of the package body 51 can be fixed to the cover 3, and the chip package 5 can be stably supported by the cover 3. Therefore, it is possible to prevent a ratio between a cross-sectional area D1 of the sub-passage on the flow rate detection element 53 side and a cross-sectional area D2 of the sub-passage on the package back surface portion side from changing due to displacement or vibration of the chip package 5, thereby obtaining high mounting accuracy.

According to the present embodiment, the convex portion 514 is provided at the center of the edge of the tip portion 511 of the package body 51, and placed on the waste substrate 11 when the chip package 5 is set on the substrate sheet 10. Therefore, the chip package 5 can be reliably positioned to the circuit board 4 and stably supported in a preset attitude. Therefore, the position and the attitude of the chip package 5 can be prevented from changing during the solder reflow, the chip package 5 can be fixed to the circuit board 4 by soldering in the preset position and the attitude, and variation in mounted chip package 5 can be reduced. Therefore, the tilt of the chip package 5 that is cantilever-supported by the circuit board 4 can be adjusted, and a high mounting accuracy during the solder reflow and mounting accuracy including variation in solder thickness can be easily secured.

Flow rate characteristics of the physical quantity detection device 1 depend on a relationship between the cross-sectional area D1 of the sub-passage on the package front surface portion side and the cross-sectional area D2 of the sub-passage on the package back surface portion side. In the present embodiment, the convex portion 514 is provided at a position where a flatness of the mounting surface 411 of the circuit board 4 and the flow rate detection element 53 is established, that is, closer to the flow rate detection element 53 than the connection terminal 52. In particular, the placing surface of the convex portion 514 placed on the waste substrate 11 has the same height as the facing surface of the connection terminal 52, and when the chip package 5 is placed on the circuit board 4, the convex portion 514 is positioned on the virtual plane Pva including the mounting surface 411 of the circuit board 4. Therefore, the chip package 5 can be easily disposed in parallel to the circuit board 4 by simply placing the chip package 5 on the substrate sheet 10. Therefore, in the physical quantity detection device 1, the cross-sectional area of the sub-passage on the exposed side of the flow rate detection element 53 is made constant, such that the flow rate detection accuracy can be stabilized.

Second Embodiment

Figure 10A:
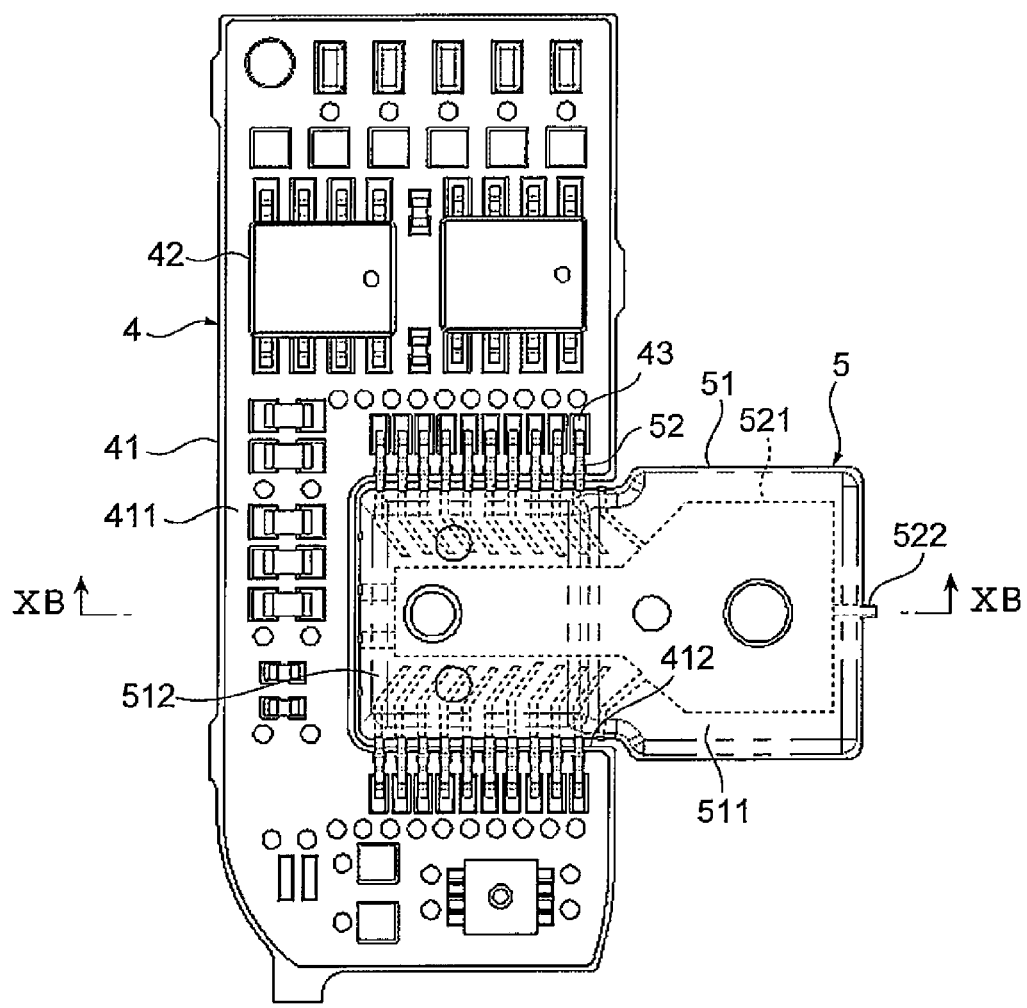
FIG. 10A is a front view of a circuit board in a second embodiment.
Figure 10B:
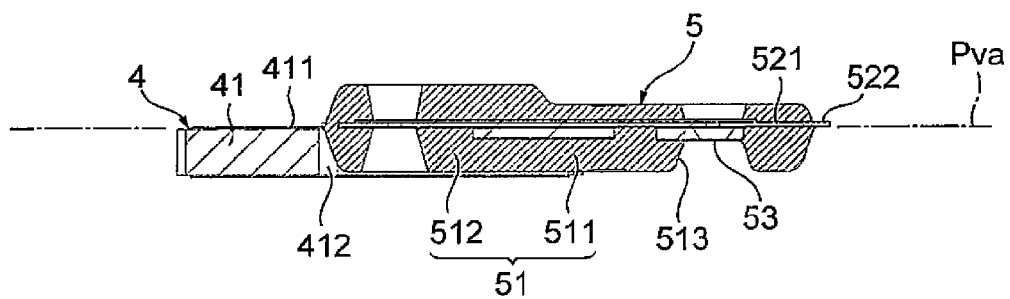
FIG. 10B is a cross-sectional view taken along line XB-XB in FIG. 10A.

FIG. 10A is a front view of a circuit board according to a second embodiment, and FIG. 10B is a cross-sectional view taken along line XB-XB in FIG. 10A.

A feature of the present embodiment is that the positioning portion is formed by a convex portion 522 extending a part of the lead frame 521 and protruded from the package body 51 of the chip package 5. As illustrated in FIG. 10A, the chip package 5 has the lead frame 521 in the package body 51. The lead frame 521 is provided between the base end portion 512 and the tip portion 511 of the package body 51, the connection terminal 52 protrudes from the base end portion 512, and the convex portion 522 as the positioning portion protrudes from the tip portion 511. The convex portion 522 is formed by a tie bar of the lead frame 521 protruding from the edge of the tip portion 511 of the package body 51.

As illustrated in (2) of FIG. 9 in the first embodiment, when the chip package 5 is set on the substrate sheet 10, the convex portion 522 can be placed on the waste substrate 11, and support the tip portion 511 of the package body 51 by the substrate sheet 10. Therefore, as in the first embodiment, the chip package 5 can be reliably positioned to the circuit board 4 and can be stably supported in a preset attitude. Therefore, the position and the attitude of the chip package 5 can be prevented from changing during the solder reflow, the chip package 5 can be fixed to the circuit board 4 by soldering in the preset position and the attitude, and variation in mounted chip package 5 can be reduced.

The placing surface of the convex portion 522 has the same height as the facing surface of the connection terminal 52, and is positioned on the virtual plane Pva including the mounting surface 411 of the circuit board 4 when the chip package 5 is placed on the circuit board 4. Therefore, the chip package 5 can be easily disposed in parallel to the circuit board 4 by simply placing the chip package 5 on the substrate sheet 10. Therefore, the cross-sectional area of the sub-passage on the exposed side of the flow rate detection element 53 is made constant, such that the detection accuracy can be stabilized.

According to the present embodiment, since the convex portion 522 is formed by protruding the part of the lead frame 521 from the package body 51 of the chip package 5, the positioning portion can be simply formed and easily implemented in the chip package 5.

Third Embodiment

Figure 11A:
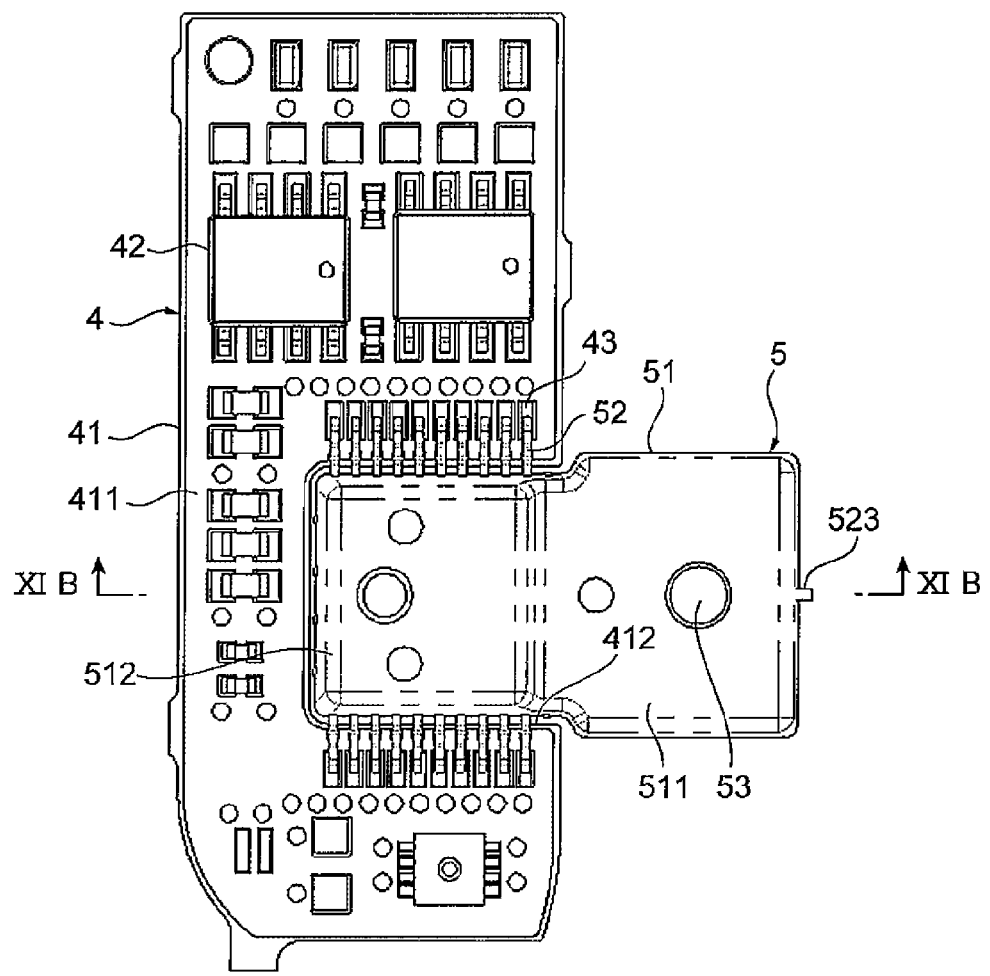
FIG. 11A is a front view of a circuit board according to a third embodiment.
Figure 11B:
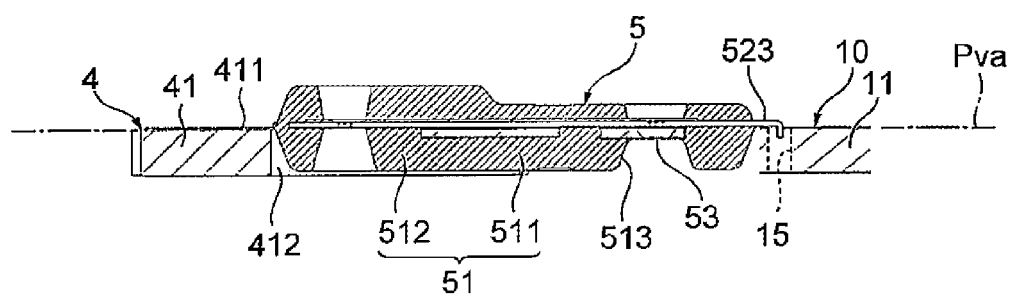
FIG. 11B is a cross-sectional view taken along line XIB-XIB in FIG. 11A.

FIG. 11A is a front view of a circuit board according to a third embodiment, and FIG. 11B is a cross-sectional view taken along line XIB-XIB in FIG. 11A.

In the present embodiment, the positioning portion is formed by a convex portion 523 with the part of the lead frame 521 protruding from the package body 51. A tip portion of the convex portion 523 is bent, and when the chip package 5 is set on the substrate sheet 10, the convex portion 523 is inserted into an insertion hole 15 provided in the waste substrate 11 in advance.

The convex portion 523 is formed in an L shape in which it protrudes from the package body 51 of the chip package 5, is bent at the tip portion, and protrudes opposite to the facing surface of the connection terminal 52. The insertion hole 15 into which a tip portion of the convex portion 523 is inserted is provided in the waste substrate 11 when the chip package 5 is set on the substrate sheet 10.

According to the present embodiment, when the chip package 5 is set on the substrate sheet 10, the convex portion 523 is placed on the waste substrate 11 and the tip portion of the convex portion 523 is inserted into the insertion hole 15. Therefore, the chip package 5 is disposed in parallel to the mounting surface 411 of the circuit board 4, and the movement of the chip package 5 in a direction along the mounting surface 411 of the circuit board 4 is restricted. Therefore, the chip package 5 can be reliably positioned to the circuit board 4 and stably supported in a preset attitude. Therefore, the position and the attitude of the chip package 5 can be prevented from changing during the solder reflow, the chip package 5 can be fixed to the circuit board 4 by soldering in the preset position and the attitude, and variation in mounted chip package 5 can be reduced. Therefore, the tilt of the chip package 5 that is cantilever-supported by the circuit board 4 can be adjusted, and a high mounting accuracy during the solder reflow and mounting accuracy including variation in a solder thickness can be easily secured.

Fourth Embodiment

Figure 12A:
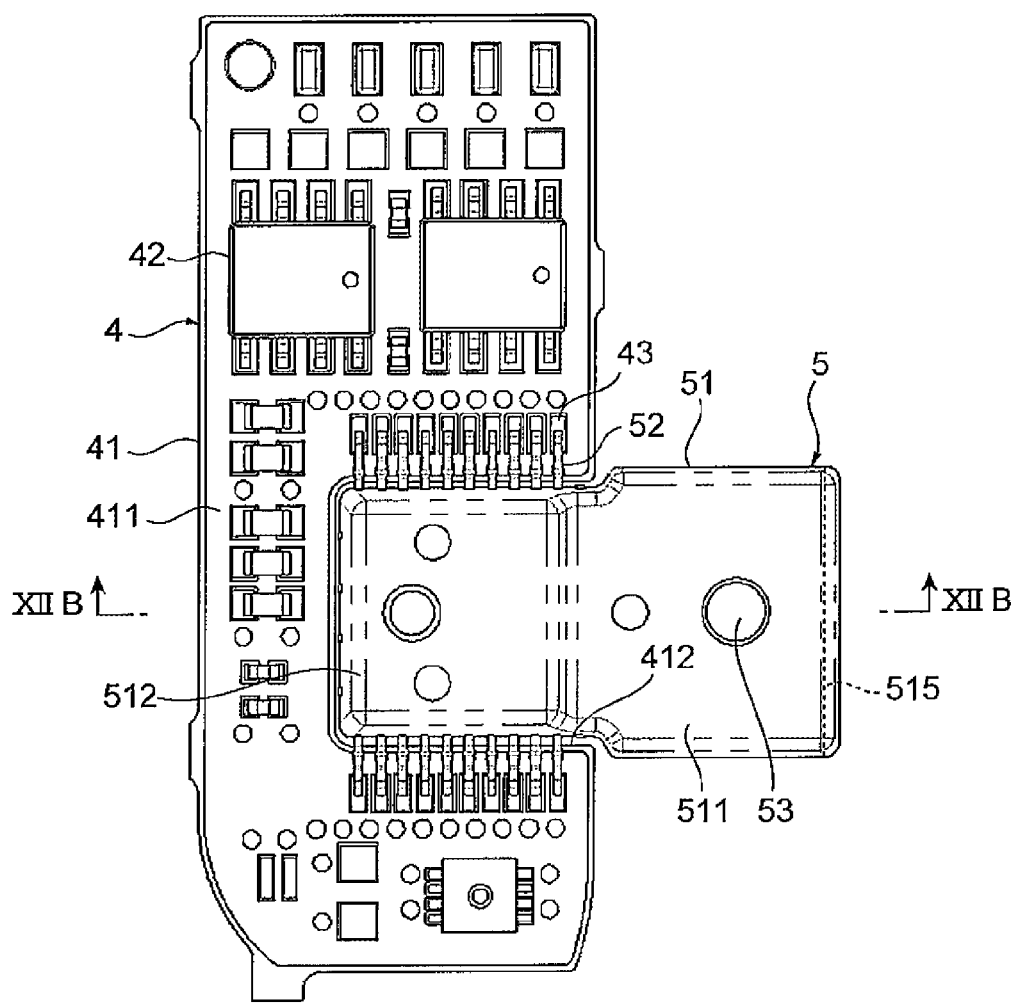
FIG. 12A is a front view of a circuit board according to a fourth embodiment.
Figure 12B:
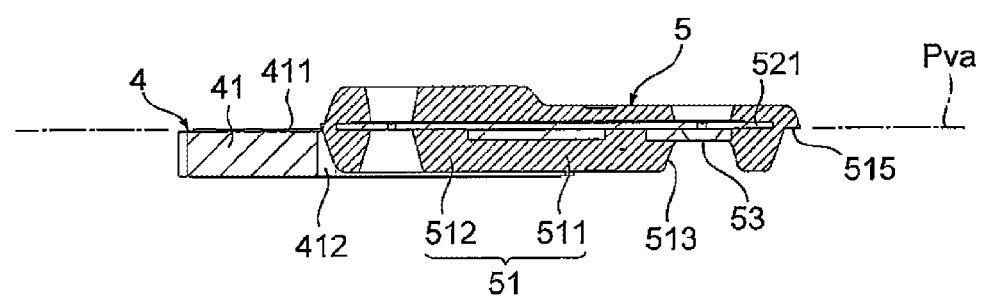
FIG. 12B is a cross-sectional view taken along line XIIB-XIIB in FIG. 12A.

FIG. 12A is a front view of a circuit board according to a fourth embodiment, and FIG. 12B is a cross-sectional view taken along line XIIB-XIIB in FIG. 12A.

In the present embodiment, a convex portion 515 extending along the edge of the tip portion 511 of the package body 51 is provided, instead of the convex portion 514 of the first embodiment. The convex portion 515 is formed of a mold resin and integrally formed when the molding is performed on the package body 51.

As illustrated in FIG. 12B, the convex portion 515 is formed by protruding the package back surface portion side from the package front surface portion side to form a step between the package front surface portion and the package back surface portion. The placing surface of the convex portion 515 has the same height as the facing surface of the connection terminal 52, and when the chip package 5 is placed on the circuit board 4, the convex portion 515 is positioned on the virtual plane Pva including the mounting surface 411 of the circuit board 4.

As in each embodiment described above, the convex portion 515 can be placed on the waste substrate 11 to position the chip package 5 on a circuit board 207, during the solder reflow. Therefore, the chip package 5 can be easily disposed in parallel to the circuit board 4 by simply placing the chip package 5 on the substrate sheet 10. Therefore, in the physical quantity detection device 1, the cross-sectional area of the sub-passage on the exposed side of the flow rate detection element 53 is made constant, such that the flow rate detection accuracy can be stabilized.

Then, as illustrated in (4) of FIG. 9 of the first embodiment, the adhesive 6 is applied between the convex portion 514 and the projection 32 of the cover 3 to fix the tip portion 511 of the package body 51 to the cover 3. Since the adhesive 6 is applied along the edge of the tip portion 511 of the package body 51, it can adhere over a longer distance than the convex portion 514 in the first embodiment. Therefore, the tip portion 511 of the package body 51 can be securely fixed to the projection 32 of the cover 3, and the sub-passage can be sealed so that the package front surface portion side and the package back surface portion side are separated completely.

Further, according to the present embodiment, the convex portion 515 has a configuration in which the step is formed between the package front surface portion and the package back surface portion with the package back surface portion side protruding from the package front surface portion side. Thus, the position of the edge of the tip portion 511 of the package body 51 on the package front surface portion side can be disposed closer to the flow rate detection element 53 than the position of the edge of the tip portion 511 of the package body 51 on the package back surface portion side, and the passage groove 513 can be sufficiently secured to be wide even when the second sub-passage is narrow.

Fifth Embodiment

Figure 13A:
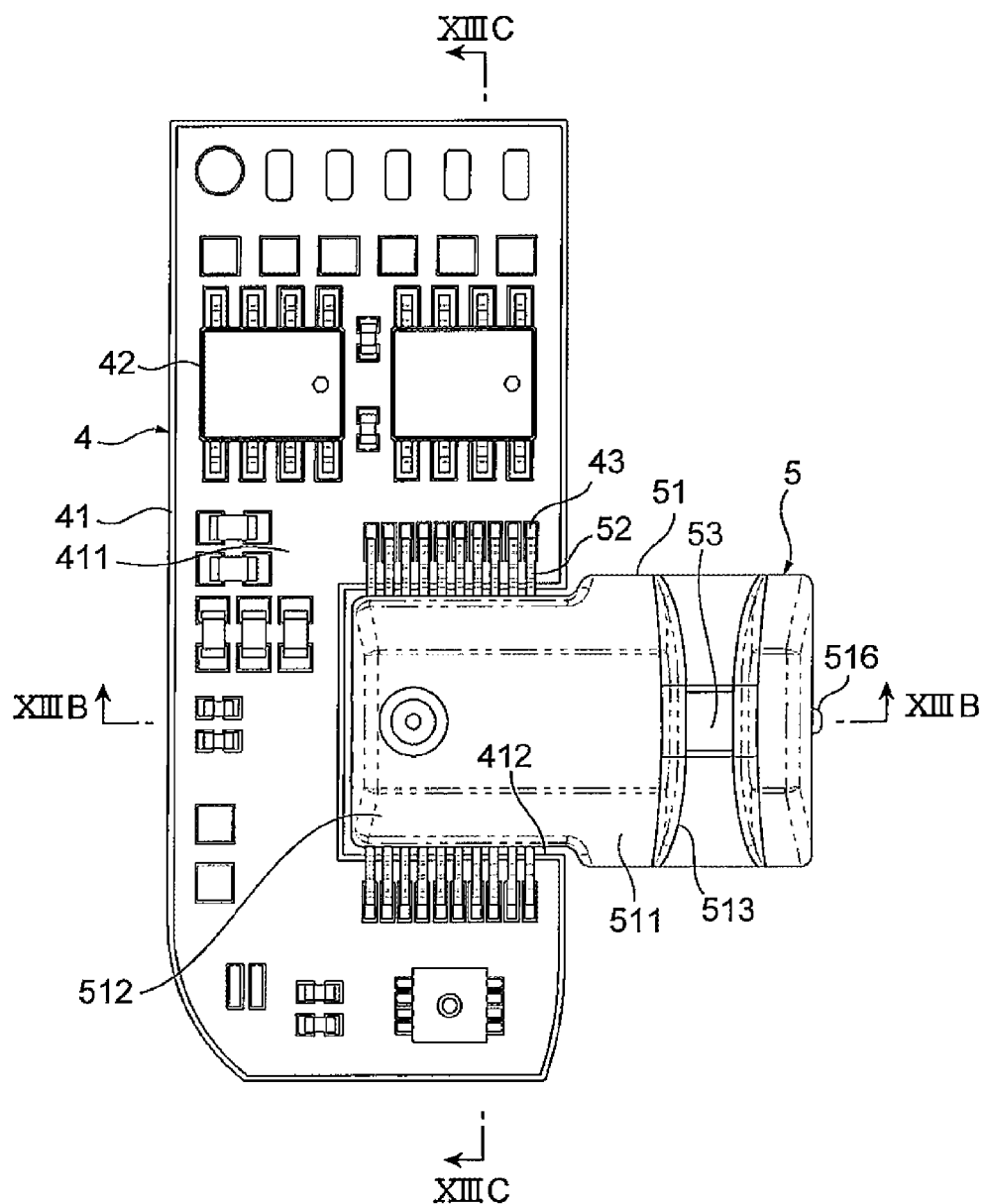
FIG. 13A is a front view of a circuit board according to a fifth embodiment.
Figure 13B:
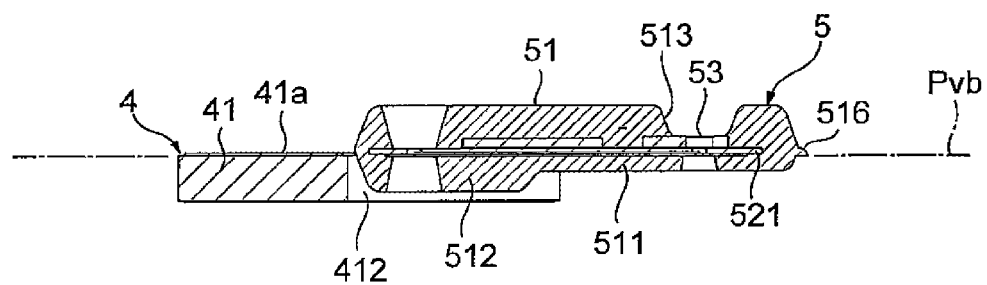
FIG. 13B is a cross-sectional view taken along line XIIIB-XIIIB in FIG. 13A.
Figure 13C:
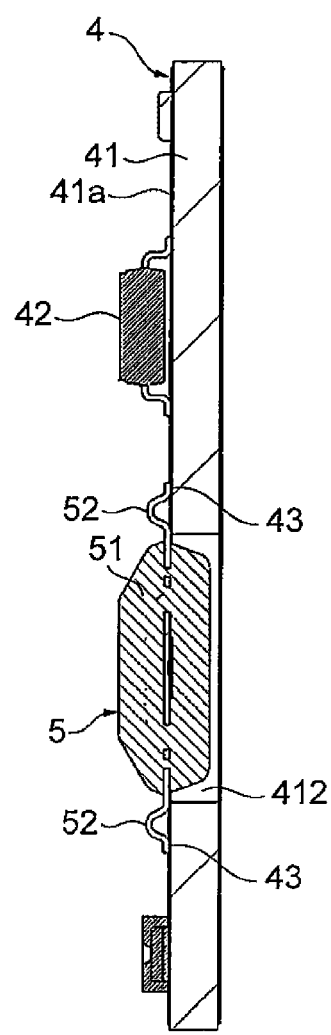
FIG. 13C is a cross-sectional view taken along line XIIIC-XIIIC in FIG. 13A.

FIG. 13A is a front view of a circuit board according to a fifth embodiment, FIG. 13B is a cross-sectional view taken along line XIIIB-XIIIB in FIG. 13A, and FIG. 13C is a cross-sectional view taken along line XIIIC-XIIIC in FIG. 13A.

In the present embodiment, a direction of the chip package 5 is opposite to that of the circuit board 4 of each embodiment described above. Specifically, the chip package 5 is disposed in a direction that an exposed surface of the flow rate detection element 53 and the facing surface of the connection terminal 52 are spaced apart from each other.

A convex portion 516 is provided at the center of the edge of the tip portion 511 of the package body 51. The convex portion 516 is formed of a mold resin and integrally formed when the molding is performed on the package body 51. The convex portion 516 has a placing surface placed on the waste substrate 11 when the chip package 5 is set on the substrate sheet 10.

The placing surface of the convex portion 516 has the same height as the facing surface of the connection terminal 52, and is positioned on a virtual plane Pvb including the mounting surface 411 of the circuit board 4 when the chip package 5 is placed on the circuit board 4. Therefore, the chip package 5 can be easily disposed in parallel to the circuit board 4 by simply placing the chip package 5 on the substrate sheet 10. Therefore, in the physical quantity detection device 1, the cross-sectional area of the sub-passage on the exposed side of the flow rate detection element 53 is made constant, such that the flow rate detection accuracy can be stabilized.

Figure 14A:
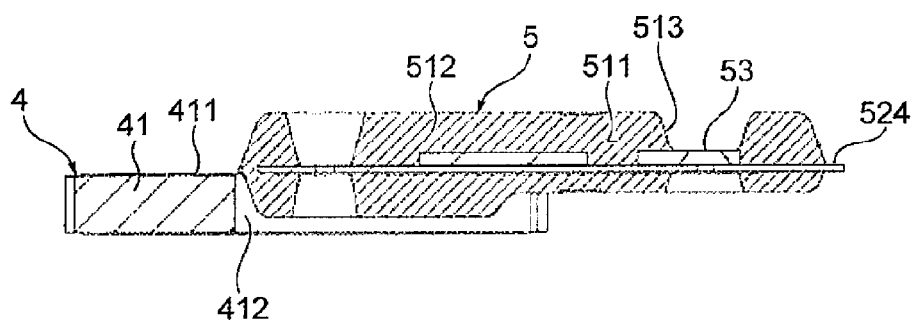
FIG. 14A is a cross-sectional view illustrating a modification of a circuit board illustrated in FIG. 13B.
Figure 14B:
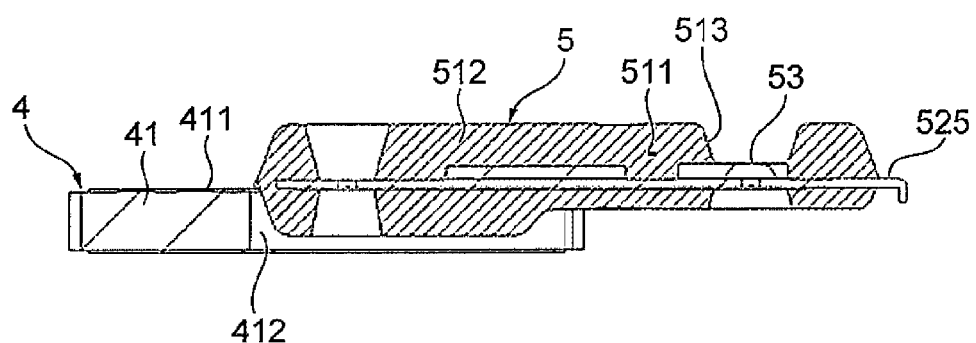
FIG. 14B is a cross-sectional view illustrating a modification of the circuit board illustrated in FIG. 13B.

FIGS. 14A and 14B are cross-sectional views illustrating a modification of the circuit board illustrated in FIG. 13B.

In the modification illustrated in FIG. 14A, instead of the convex portion 516, the convex portion 524 with the part of the lead frame 521 protruding from the package body 51 of the chip package 5 is provided by applying a configuration illustrated in FIGS. 10A and 10B in the second embodiment. In addition, in the modification illustrated in FIG. 14B, instead of the convex portion 516, the convex portion 525 with the bent tip portion is provided by applying a configuration illustrated in FIGS. 11A and 11B in the third embodiment. When the chip package 5 is set on the substrate sheet 10, the convex portion 525 with the bent tip portion is inserted into the insertion hole 15 provided in the waste substrate 11 in advance. In respective modifications illustrated in FIGS. 14A and 14B, the same effect as the second and third embodiments can be obtained.

Sixth Embodiment

Figure 15A:
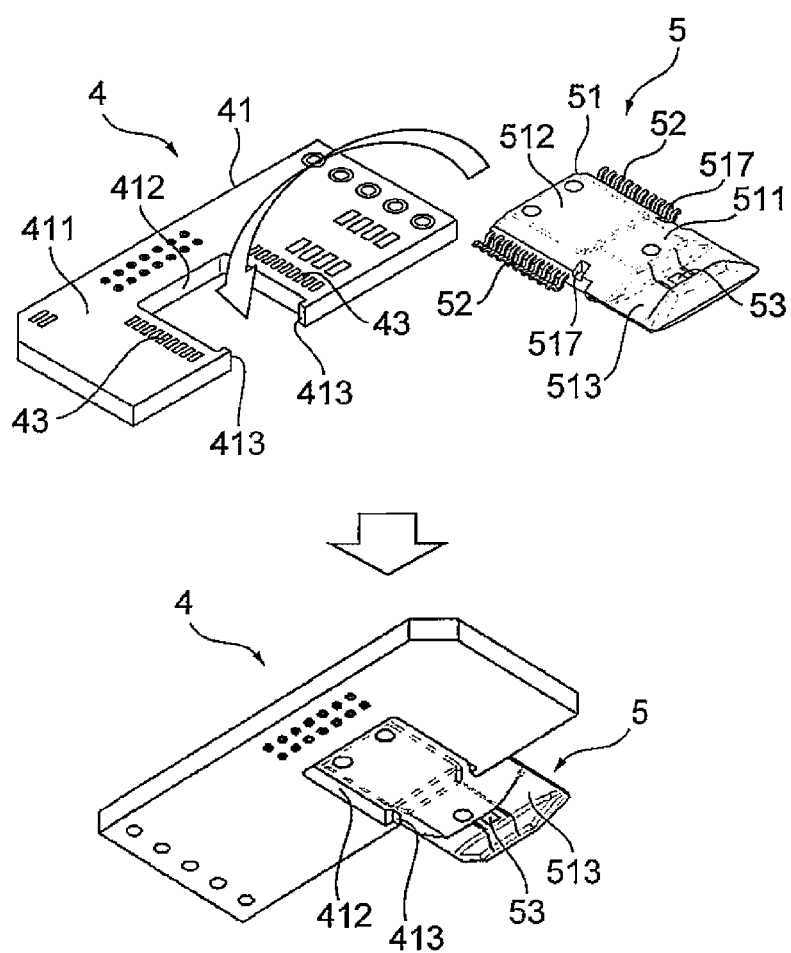
FIG. 15A is a perspective view for explaining a sixth embodiment.
Figure 15B:
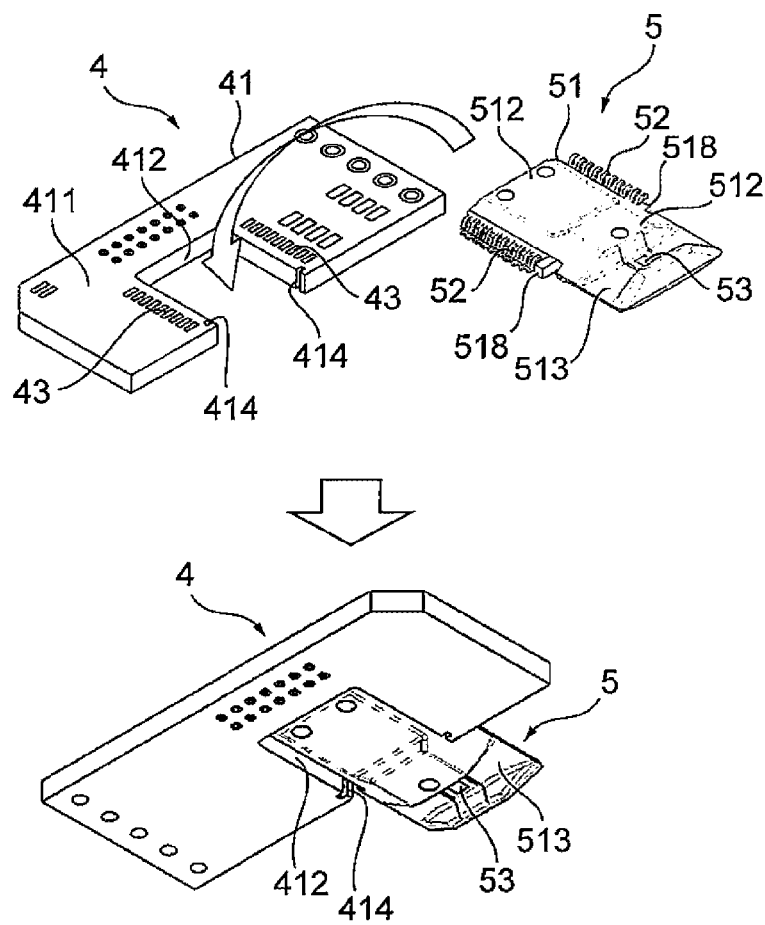
FIG. 15B is a perspective view for explaining the sixth embodiment.

FIGS. 15A and 15B are perspective views for explaining a sixth embodiment.

The positioning portion of the present embodiment has a package concave portion 517 or a package convex portion 518 formed in the chip package 5, and a substrate convex portion 413 formed in the circuit board 4 and fitted into the package concave portion 517 or a substrate concave portion 414 fitted into the package convex portion 518.

In a case of the embodiment illustrated in FIG. 15A, the package concave portion 517 is recessed in the package front surface portion of the package body 51. The package concave portions 517 are provided in pairs at a position between the base end portion 512 and the tip portion 511 of the package body 51 and at a position in which the package concave portions 517 are spaced apart from one side and the other side of the package body 51 in the lateral direction. On the other hand, the substrate convex portion 413 is formed so as to protrude in a direction approaching each other at the inlet part of the accommodating portion 412 of the substrate body 41, and is pressed into the package concave portion 517 by placing the chip package 5 on the circuit board 4.

The substrate convex portion 413 is pressed into the package concave portion 517, such that the chip package 5 is positioned and fixed to the circuit board 4, and the connection terminal 52 of the chip package 5 abuts on the pads 43 of the circuit board 4. Therefore, the chip package 5 is transported in a reflow furnace in a state as the connection terminal 52 of the chip package 5 abutted on the pad 43 of the circuit board 4, such that the connection terminal 52 of the chip package 5 can be soldered to the pad 43 of the circuit board 4, and the chip package 5 can be fixed to the circuit board 4 by soldering.

In a case of the embodiment illustrated in FIG. 15B, the package convex portion 518 is projected on the package front surface portion of the package body 51. The package convex portions 518 are provided in pairs at a position between the base end portion 512 and the tip portion 511 of the package body 51 and at a position in which the package convex portions 518 are spaced apart from one side and the other side of the package body 51 in the lateral direction. On the other hand, the substrate concave portions 414 are formed in a concave shape in a direction to be spaced apart from each other at the inlet part of the accommodating portion 412 of the substrate body 41, and are pressed into the package convex portions 518 by placing the chip package 5 on the circuit board 4.

The package convex portion 518 is pressed into the substrate concave portions 414, such that the chip package 5 is positioned and fixed to the circuit board 4, and the connection terminal 52 of the chip package 5 abut on the pads 43 of the circuit board 4. Therefore, the chip package 5 is transported in a reflow furnace in a state as the connection terminal 52 of the chip package 5 abutted on the pad 43 of the circuit board 4, such that the connection terminal 52 of the chip package 5 can be soldered to the pad 43 of the circuit board 4, and the chip package 5 can be fixed to the circuit board 4 by soldering.

According to the embodiment illustrated in FIGS. 15A and 15B, the package concave portions 517 or the package convex portions 518 are provided in the chip package 5 and the substrate convex portions 413 or the substrate concave portions 414 are provided in the circuit board 4. When the chip package 5 is assembled on the circuit board 4, the substrate convex portions 413 are pressed into the package concave portions 517 or the package convex portions 518 are pressed into the substrate concave portions 414.

Therefore, the chip package 5 can be reliably positioned to the circuit board 4 and stably supported in a preset attitude. Therefore, the position and the attitude of the chip package 5 can be prevented from changing during the solder reflow, the chip package 5 can be fixed to the circuit board 4 by soldering in the preset position and the attitude, and variation in mounted chip package 5 can be reduced. Therefore, the tilt of the chip package 5 that is cantilever-supported by the circuit board 4 can be adjusted, and a high mounting accuracy during the solder reflow and mounting accuracy including variation in solder thickness can be easily secured.

In addition, according to the present embodiment, since the chip package 5 can be positioned only by assembling the chip package 5 on the circuit board 4, the waste substrate 11 of the above-described embodiments can be omitted.

Seventh Embodiment

Figure 16A:
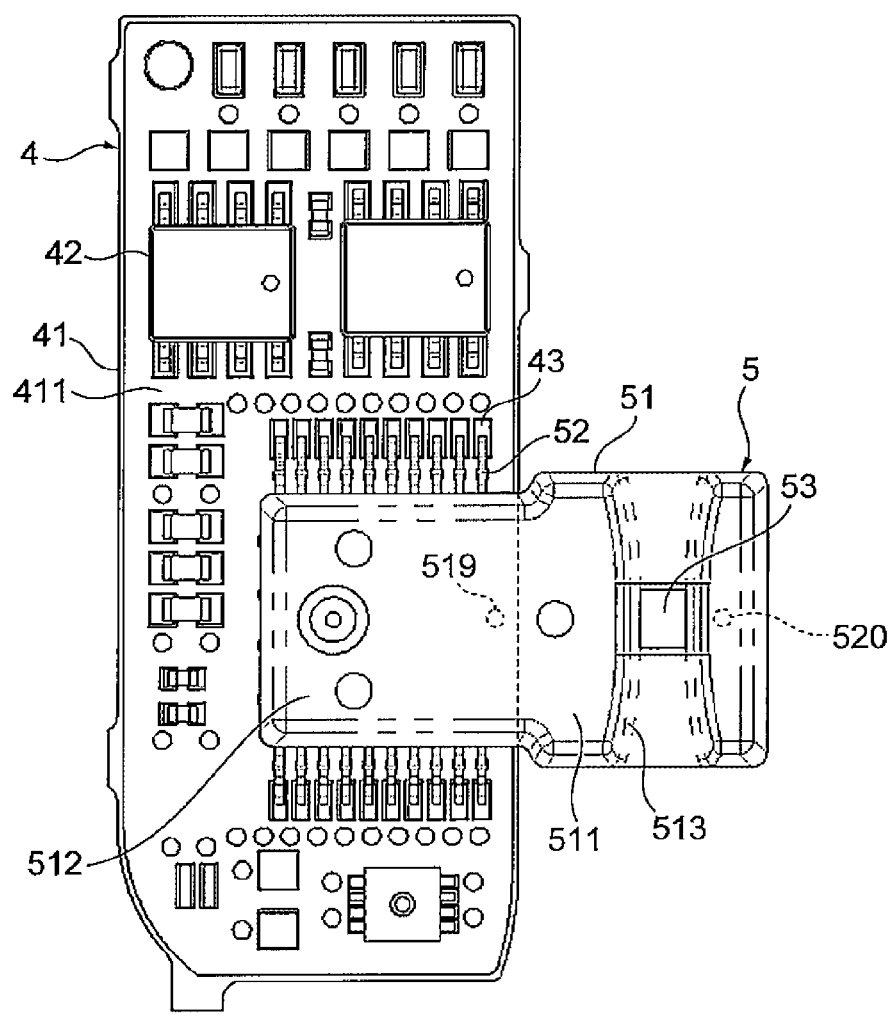
FIG. 16A is a front view of a circuit board according to a seventh embodiment.
Figure 16B:
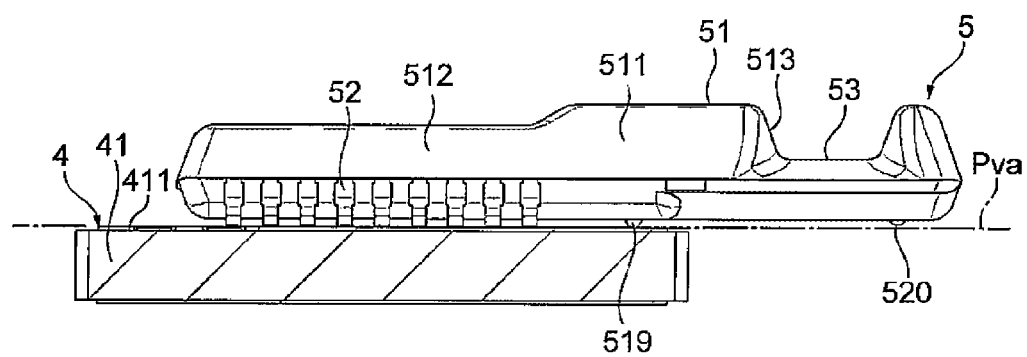
FIG. 16B is a bottom view of the circuit board illustrated in FIG. 16A.
Figure 16C:
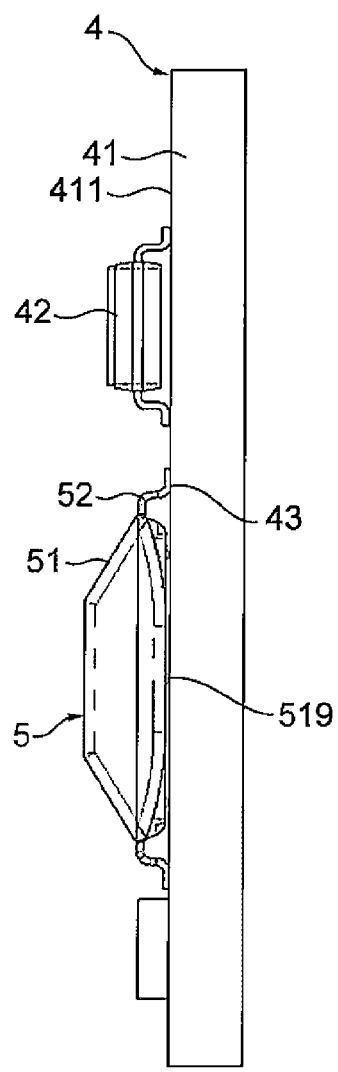
FIG. 16C is a right side view of the circuit board illustrated in FIG. 16A.

FIG. 16A is a front view of a circuit board according to a seventh embodiment, FIG. 16B is a bottom view of the circuit board illustrated in FIG. 16A, and FIG. 16C is a right side view of the circuit board illustrated in FIG. 16A.

A feature of the present embodiment is that the chip package 5 is disposed on the mounting surface 411 of the substrate body 41.

Unlike the other embodiments, the circuit board 4 has a substantially rectangular shape, and the accommodating portion 412 is omitted in the substrate body 41. The chip package 5 is disposed on the mounting surface 411 of the circuit board 4 in an attitude that the package back surface portion of the chip package 5 is opposite to the mounting surface 411 of the circuit board 4.

As illustrated in FIG. 16B, the connection terminal 52 of the chip package 5 has a facing surface disposed at a position where it protrudes from the package back surface portion in a thickness direction of the package body 51. A positioning portion for positioning and fixing the chip package 5 is provided on the package back surface portion of the chip package 5. As illustrated in FIG. 16B, the positioning portion is provided at a position closer to the tip portion 511 than the base end portion 512 of the chip package 5, and has convex portions 519 and 520. The convex portions 519 and 520 are formed of a mold resin and integrally formed when the molding is performed on the package body 51.

As illustrated in FIG. 16A, the convex portions 519 and 520 are provided one by one at the center position in the lateral direction of the package body 51. The convex portion 519 is disposed at a position opposite to the mounting surface 411 of the circuit board 4, and the convex portion 520 is disposed at a position opposite to the waste substrate 11 (see FIG. 8). The convex portions 519 and 520 have the same height as the facing surface of the connection terminal 52, and are positioned on the virtual plane Pva including the mounting surface 411 of the circuit board 5 when the chip package 5 is placed on the circuit board 4.

Therefore, the chip package 5 can be easily disposed in parallel to the circuit board 4 by simply placing the chip package 5 on the substrate sheet 10. Therefore, in the physical quantity detection device 1, the cross-sectional area of the sub-passage on the exposed side of the flow rate detection element 53 is made constant, such that the flow rate detection accuracy can be stabilized.

According to the present embodiment, the convex portions 519 and 520 are provided at the package back surface portion of the tip portion 511 of the package body 51, and supported on the circuit board 4 and the waste substrate 11 when the chip package 5 is set on the substrate sheet 10. Therefore, the chip package 5 can be reliably positioned to the circuit board 4 and stably supported in a preset attitude. Therefore, the position and the attitude of the chip package 5 can be prevented from changing during the solder reflow, the chip package 5 can be fixed to the circuit board 4 by soldering in the preset position and the attitude, and variation in mounted chip package 5 can be reduced. Therefore, the tilt of the chip package 5 that is cantilever-supported by the circuit board 4 can be adjusted, and a high mounting accuracy during the solder reflow and mounting accuracy including variation in solder thickness can be easily secured.

Although the embodiments of the present invention have been described in detail above, the present invention is not limited thereto. Various modifications and variations are possible insofar as they are within the spirit and scope of the appended claims of the present invention. For example, the aforementioned embodiment has been described in detail in order to explain the invention in an easily comprehensible manner and is not necessarily limited to the embodiment having all the configurations explained above. Further, a part of the configuration of a certain embodiment can be replaced with the configuration of another embodiment and the configuration of another embodiment can be added to the configuration of a certain embodiment. Furthermore, regarding a part of the configuration of each embodiment, the configuration of another configuration can be added to, deleted from, or replaced with the above-mentioned part of the configuration.

REFERENCE SIGNS LIST

1 physical quantity detection device
4 circuit board
5 chip package
43 pad
51 package body
52 connection terminal (solder fixation portion)
53 flow rate detection element
413 substrate convex portion
414 substrate concave portion
514, 515, 516, 522, 523, 524, 525 convex portion (positioning portion)
517 package concave portion (positioning portion)
518 package convex portion (positioning portion)

The invention claimed is:

1. A chip package positioning and fixing structure that positions and fixes, to a circuit board, a chip package in which a flow rate detection element is sealed with a resin so that a detection portion is at least exposed,
   wherein the chip package includes a solder fixation portion that fixes the chip package to the circuit board by soldering, and a positioning portion that performs positioning to the circuit board, and
   the positioning portion is provided closer to the flow rate detection element than to the solder fixation portion.

2. The chip package positioning and fixing structure according to claim 1,
   wherein the positioning portion has a package concave portion or a package convex portion formed in the chip package, and a substrate convex portion formed in the circuit board and fitted into the package concave portion or a substrate concave portion fitted into the package convex portion.

3. The chip package positioning and fixing structure according to claim 1,
   wherein the chip package includes a package body having a base end portion at which the solder fixation portion is provided and a tip portion at which the positioning portion is provided,
   the positioning portion has a convex portion formed in the tip portion of the package body,
   the solder fixation portion has a connection terminal protruding from the base end portion of the package body, and
   the convex portion and the connection terminal are positioned on a virtual plane including a mounting surface of the circuit board.

4. The chip package positioning and fixing structure according to claim 3, wherein the convex portion abuts on a waste substrate that supports the circuit board.

5. The chip package positioning and fixing structure according to claim 3, wherein the convex portion is formed of the resin.

6. The chip package positioning and fixing structure according to claim 4,
   wherein the chip package has a lead frame on which the flow rate detection element is mounted, and
   the convex portion is formed by protruding a part of the lead frame from the package body.

7. The chip package positioning and fixing structure according to claim 6,
   wherein the convex portion has an L shape in which the convex portion protrudes from the package body along a frame surface of the lead frame, is bent at the tip portion, and protrudes to a connection surface side of the connection terminal, and
   an insertion hole into which the tip portion of the convex portion is inserted is provided in the waste substrate.

8. The chip package positioning and fixing structure according to claim 3, wherein the convex portion is adhered to a housing of a physical quantity detection device when the circuit board is attached to the housing.

* * * * *